(12) United States Patent
Ishida et al.

(10) Patent No.: US 9,185,799 B2
(45) Date of Patent: Nov. 10, 2015

(54) PRINTED WIRING BOARD

(71) Applicant: IBIDEN CO., LTD., Ogaki-shi (JP)

(72) Inventors: Naoto Ishida, Ogaki (JP); Takema Adachi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 113 days.

(21) Appl. No.: 13/836,123

(22) Filed: Mar. 15, 2013

(65) Prior Publication Data

US 2013/0240258 A1    Sep. 19, 2013

(30) Foreign Application Priority Data

Mar. 19, 2012 (JP) ................. 2012-061592

(51) Int. Cl.
| | |
|---|---|
| H05K 1/00 | (2006.01) |
| H05K 1/03 | (2006.01) |
| H05K 3/46 | (2006.01) |
| H05K 1/02 | (2006.01) |
| H05K 1/18 | (2006.01) |

(52) U.S. Cl.
CPC ............ *H05K 1/0306* (2013.01); *H05K 3/4673* (2013.01); *H05K 1/0271* (2013.01); *H05K 1/185* (2013.01); *H05K 2201/0209* (2013.01); *H05K 2201/068* (2013.01)

(58) Field of Classification Search
CPC . H05K 3/4602; H05K 3/4608; H05K 1/0271; H05K 1/0366; H05K 2201/068; H05K 3/4644
USPC ................... 174/258, 260–262; 361/792–795
See application file for complete search history.

(56) References Cited

U.S. PATENT DOCUMENTS

2008/0011507 A1*  1/2008  Vasoya ................. 174/260
2012/0043123 A1*  2/2012  Takada et al. .......... 174/258

FOREIGN PATENT DOCUMENTS

JP    2011-100908    5/2011

OTHER PUBLICATIONS

U.S. Appl. No. 13/690,570, filed Nov. 30, 2012, Ishida, et al.

* cited by examiner

*Primary Examiner* — Hung S Bui
*Assistant Examiner* — James Wu
(74) *Attorney, Agent, or Firm* — Oblon, McClelland, Maier & Neustadt, L.L.P.

(57) ABSTRACT

A printed wiring board includes a core substrate including an insulative substrate, a first conductive layer formed on first surface of the insulative substrate, and a second conductive layer formed on second surface of the insulative substrate, a first buildup laminated on first surface of the core and including an interlayer insulation layer, a conductive layer formed on the insulation layer, and a via conductor penetrating through the insulation layer and connected to the conductive layer, and a second buildup laminated on second surface of the core and including an interlayer insulation layer, a conductive layer formed on the interlayer insulation layer, and a via conductor penetrating through the insulation layer and connected to the conductive layer. The insulation layer of the first buildup has thermal expansion coefficient set higher than thermal expansion coefficient of the insulation layer of the second buildup.

20 Claims, 19 Drawing Sheets

FIG. 3
(A)
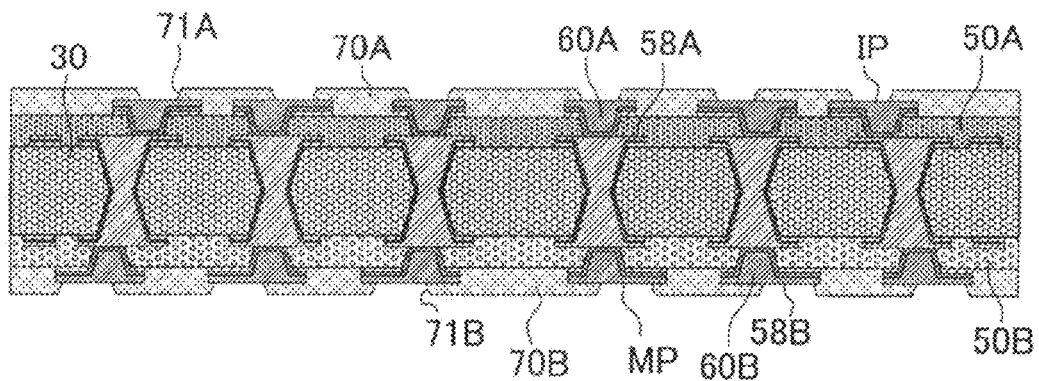
(B)
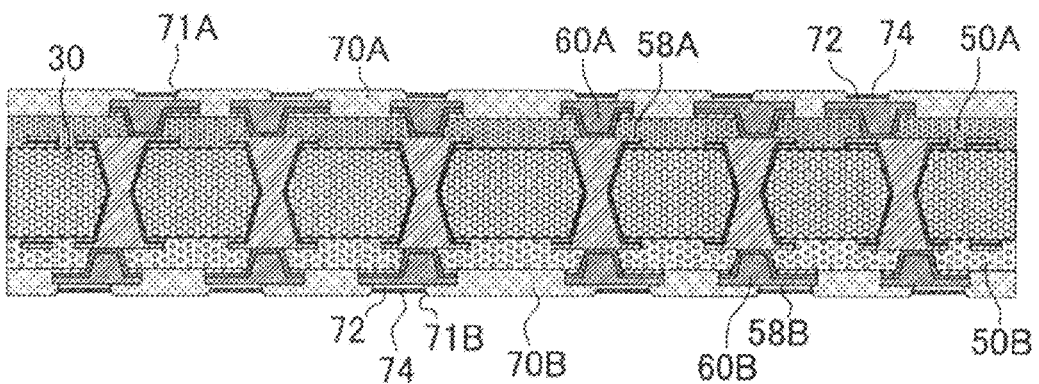

FIG. 8
(A)
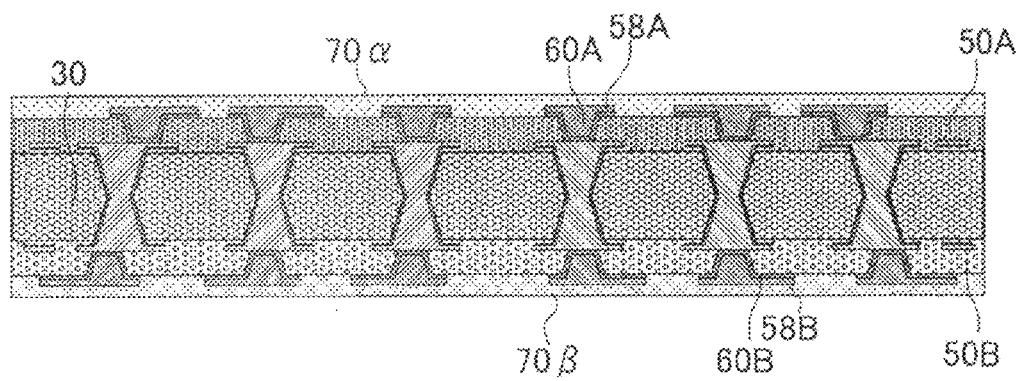
(B)
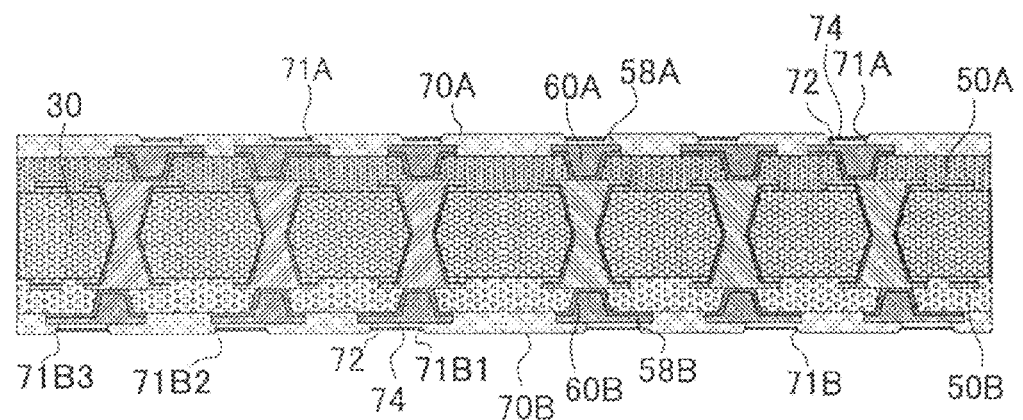

FIG. 17
(A)
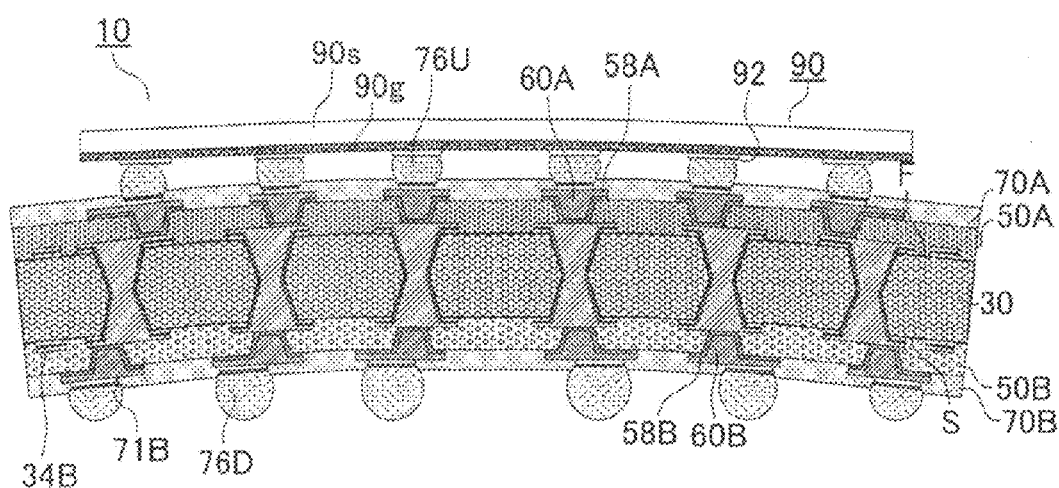
(B)
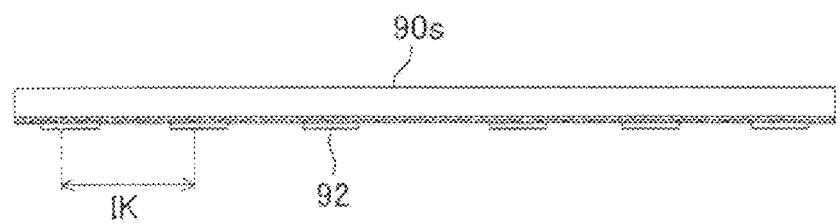

FIG. 18
(A)
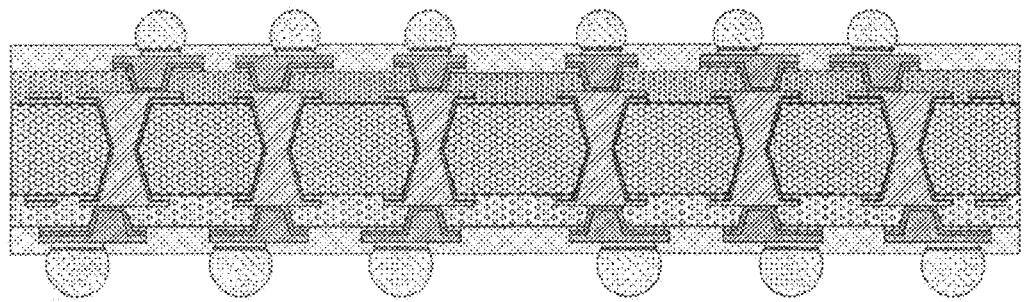
(B)
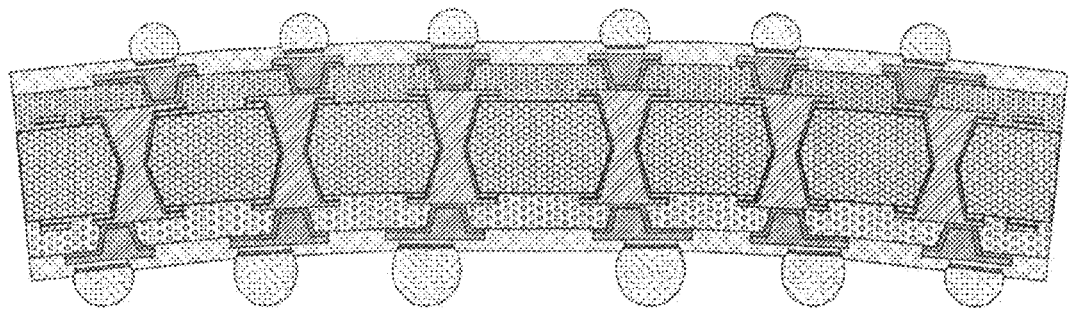
(C)
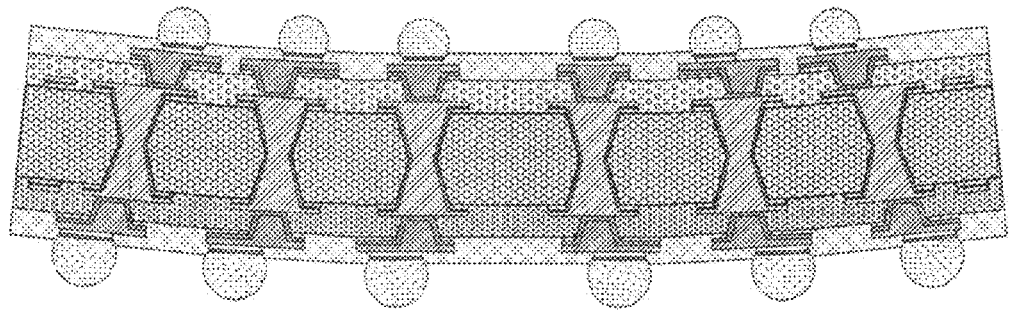

PRINTED WIRING BOARD

CROSS-REFERENCE TO RELATED APPLICATIONS

The present application is based upon and claims the benefit of priority to Japanese Patent Application No. 2012-061592, filed Mar. 19, 2012, the entire contents of which are incorporated herein by reference.

BACKGROUND OF THE INVENTION

1. Field of the Invention

The present invention relates to a printed wiring board having a core substrate and upper and lower buildup layers.

2. Description of Background Art

Japanese Laid-Open Patent Publication No. 2011-100908 relates to a printed wiring board having through holes (penetrating holes) formed using a laser. The printed wiring board of Japanese Laid-Open Patent Publication No. 2011-100908 has through holes that become narrower from an upper surface of the core substrate toward a lower surface and through holes that become narrower from the lower surface toward the upper surface so that warping of the printed wiring board is reduced. Semiconductor devices may be manufactured by mounting IC chips on printed wiring boards. Such mounting may be conducted through a reflow process. The entire contents of this publication are incorporated herein by reference.

SUMMARY OF THE INVENTION

According to one aspect of the present invention, a printed wiring board includes a core substrate including an insulative substrate, a first conductive layer formed on a first surface of the insulative substrate, and a second conductive layer formed on a second surface of the insulative substrate, a first buildup layer laminated on a first surface of the core substrate and including an interlayer resin insulation layer, a conductive layer formed on the interlayer resin insulation layer of the first buildup layer, and a via conductor penetrating through the interlayer resin insulation layer of the first buildup layer and connected to the conductive layer of the first buildup layer, and a second buildup layer laminated on a second surface of the core substrate and including an interlayer resin insulation layer, a conductive layer formed on the interlayer resin insulation layer of the second buildup layer, and a via conductor penetrating through the interlayer resin insulation layer of the second buildup layer and connected to the conductive layer of the second buildup layer. The interlayer resin insulation layer of the first buildup layer has a thermal expansion coefficient which is set higher than a thermal expansion coefficient of the interlayer resin insulation layer of the second buildup layer.

According to another aspect of the present invention, a printed wiring board includes a core substrate including an insulative substrate, a first conductive layer formed on a first surface of the insulative substrate, a second conductive layer formed on a second surface of the insulative substrate, and a through-hole conductor penetrating through the insulative substrate and connecting the first conductive layer and the second conductive layer, a first buildup layer including an interlayer resin insulation layer laminated on the first surface of the insulative substrate and the first conductive layer, a conductive layer formed on the interlayer resin insulation layer of the first buildup layer, and a via conductor penetrating through the interlayer resin insulation layer of the first buildup layer and connecting the conductive layer of the first buildup layer to one of the through-hole conductor and the first conductive layer in the core substrate, and a second buildup layer including an interlayer resin insulation layer laminated on the second surface of the insulative substrate and the second conductive layer, a conductive layer formed on the interlayer resin insulation layer of the second buildup layer, and a via conductor penetrating through the interlayer resin insulation layer of the second buildup layer and connecting the conductive layer of the second buildup layer to one of the through-hole conductor and the second conductive layer in the core substrate. The interlayer resin insulation layer of the first buildup layer has a thermal expansion coefficient which is set higher than a thermal expansion coefficient of the interlayer resin insulation layer of the second buildup layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3(A)-3(B) are views of steps showing a method for manufacturing a printed wiring board according to the first embodiment;

FIGS. 8(A)-8(B) are views of steps showing a method for manufacturing a printed wiring board according to a third embodiment;

FIG. 17(A) is a view of an applied example of the first embodiment; FIG. 17(B) is a view of an IC chip;

FIGS. 18(A)-18(C) are examples of warping of printed wiring boards at mounting temperature.

DETAILED DESCRIPTION OF THE EMBODIMENTS

Figure 1:
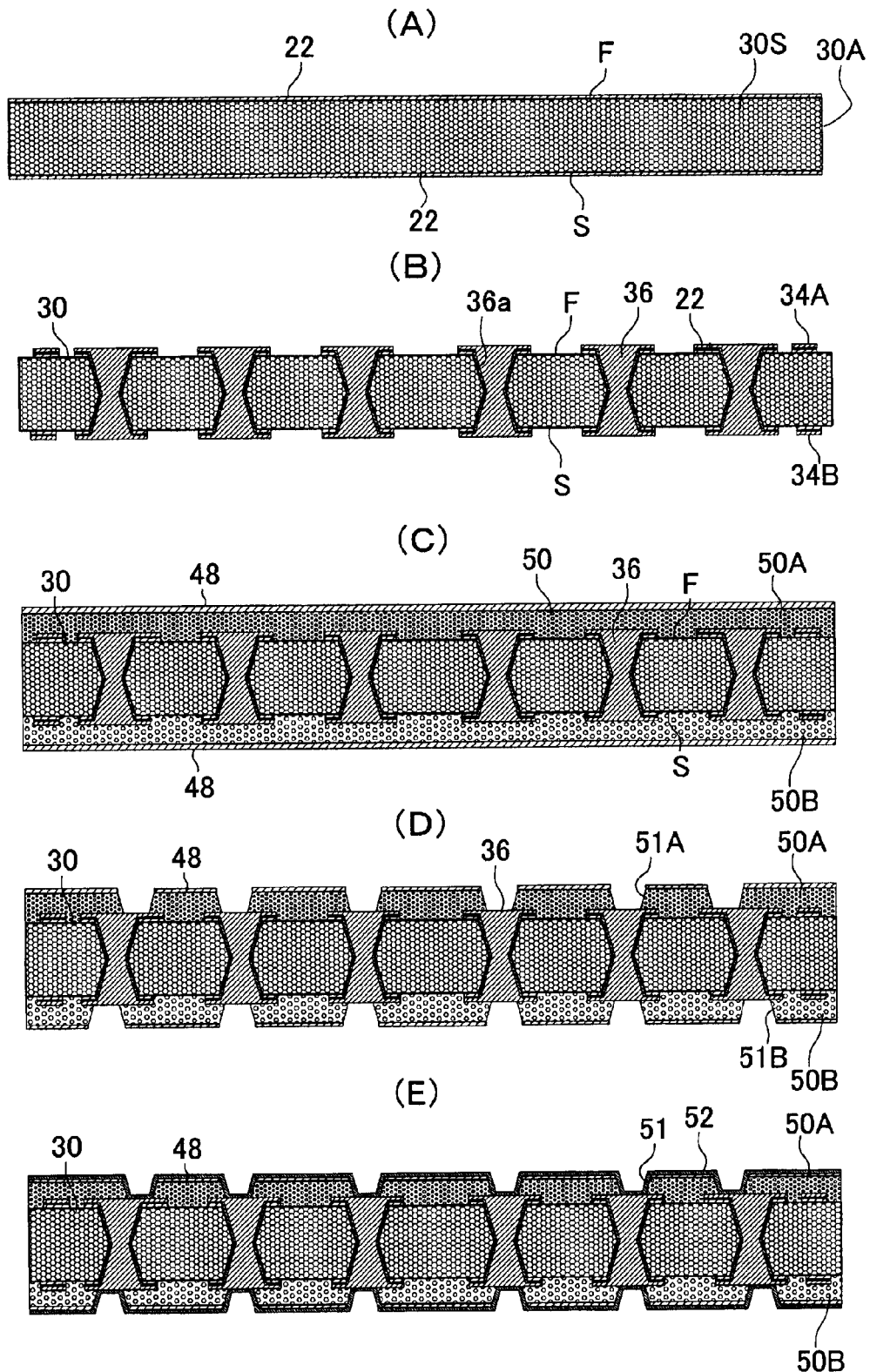
FIGS. 1(A)-1(E) are views of steps showing a method for manufacturing a printed wiring board according to a first embodiment of the present invention.

The embodiments will now be described with reference to the accompanying drawings, wherein like reference numerals designate corresponding or identical elements throughout the various drawings.

First Embodiment

Figure 7:
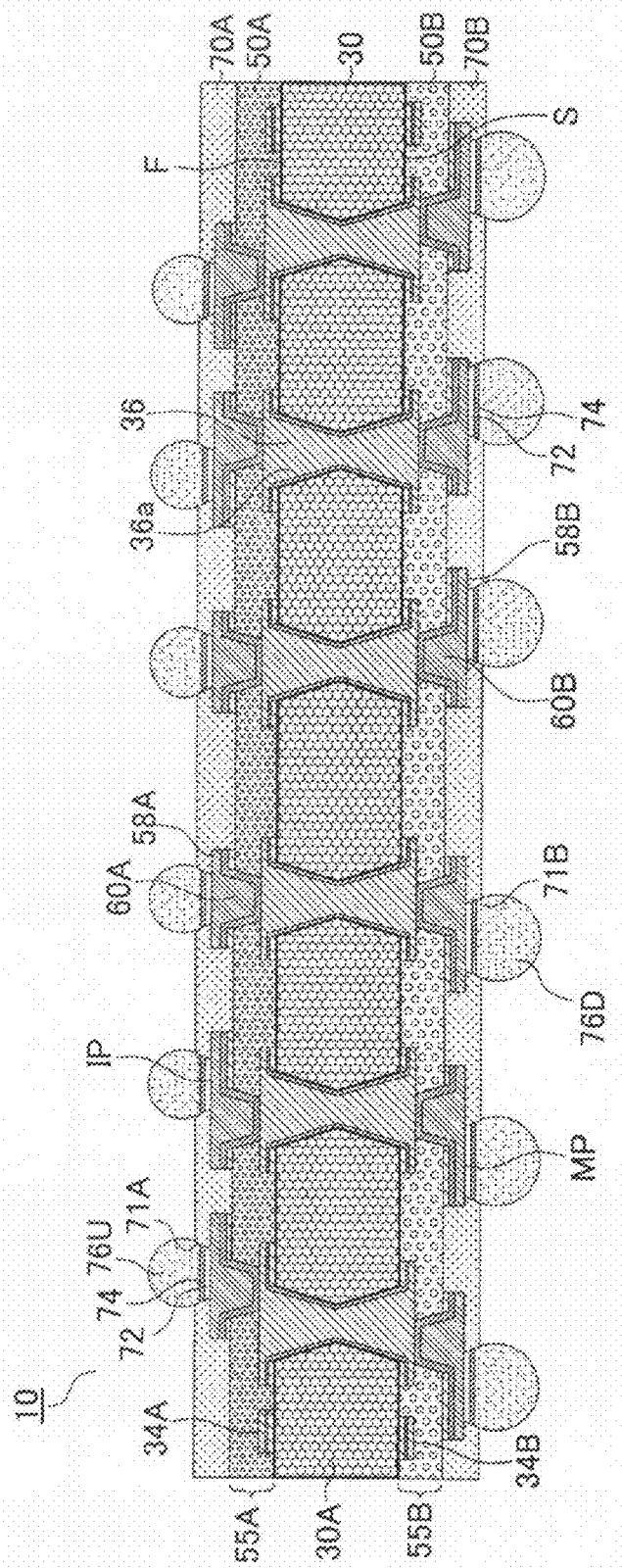
FIG. 7 is a cross-sectional view of a printed wiring board according to the first embodiment.

FIG. 7 shows a printed wiring board according to a first embodiment of the present invention. Printed wiring board 10 of the first embodiment has core substrate 30. The core substrate has insulative substrate (30A) having first surface (F) and second surface (S) opposite the first surface, first conductive layer (34A) formed on first surface (F) of the insulative substrate, and second conductive layer (34B) formed on the second surface of the insulative substrate. The core substrate further includes through-hole conductors 36 connecting first conductive layer (34A) and second conductive layer (34B). A through-hole conductor is formed in penetrating hole (36a) which penetrates through the insulative substrate. Penetrating holes (36a) and through-hole conductors are shaped like an hourglass. The core substrate shown in FIG. 7 may be manufactured by a method described in U.S. Pat. No. 7,786,390, for example. Conductive layers of the core substrate include multiple conductive circuits and through-hole lands formed around through-hole conductors. The first surface of the core substrate corresponds to the first surface of the insulative substrate, and the second surface of the core substrate corresponds to the second surface of the insulative substrate.

Figure 6:
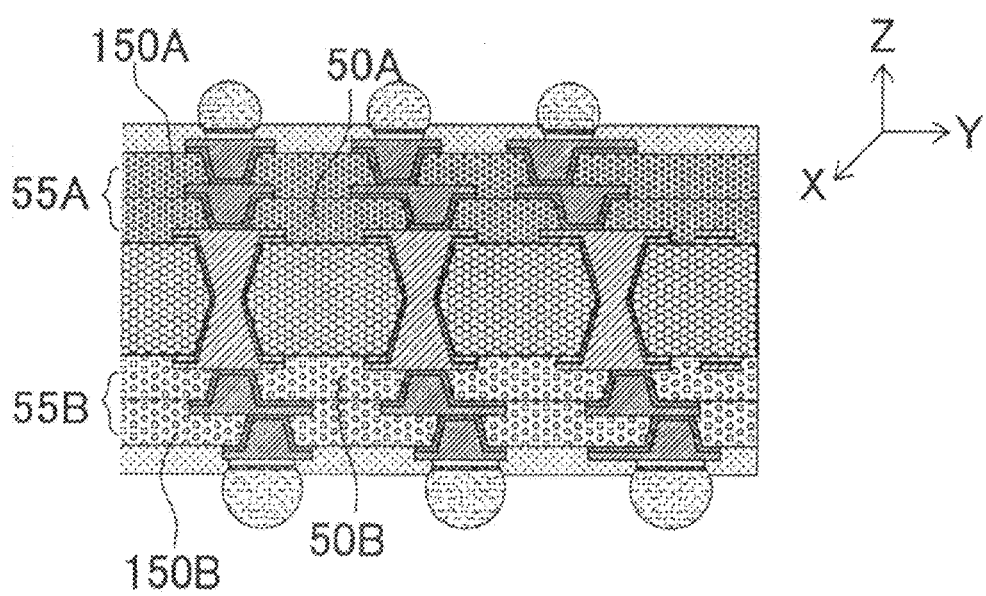
FIG. 6 is a view showing a cross section of a printed wiring board and axes.

Uppermost interlayer resin insulation layer (50A) is formed on first surface (F) of core substrate 30 and on first conductive layer (34A). Uppermost conductive layer (58A) is formed on interlayer resin insulation layer (50A). Uppermost conductive layer (58A) is connected to first conductive layer (34A) and through-hole conductors by uppermost via conductors (60A) penetrating through uppermost interlayer resin insulation layer (50A). Upper buildup layer (55A) is made up of uppermost interlayer resin insulation layer (50A), uppermost conductive layer (58A) and uppermost via conductors (60A). The upper buildup layer is single layered in the first embodiment. FIG. 6 shows a cross-sectional view of the printed wiring board and directions (X, Y, Z). Later-described thermal expansion coefficients and Young's moduli are values in directions (X-Y). Direction Z is a cross-sectional direction of a printed wiring board. The unit of thermal expansion coefficients is 1/K.

Lowermost interlayer resin insulation layer (50B) is formed on second surface (S) of core substrate 30 and on second conductive layer (34B). Lowermost conductive layer (58B) is formed on lowermost interlayer resin insulation layer (50B). Lowermost conductive layer (58B) is connected to second conductive layer (34B) and through-hole conductors by lowermost via conductors (60B) penetrating through lowermost interlayer resin insulation layer (50B). Lower buildup layer (55B) is made up of lowermost interlayer resin insulation layer (50B), lowermost conductive layer (58B) and lowermost via conductors (60B). The lower buildup layer is single layered in the first embodiment. The thermal expansion coefficient of the uppermost interlayer resin insulation layer is higher than that of the lowermost interlayer resin insulation layer.

Upper solder-resist layer (70A) is formed on the upper buildup layer and lower solder-resist layer (70B) is formed on the lower buildup layer. Solder-resist layer (70A) has openings (71A) which expose upper surfaces of the uppermost conductive layer and uppermost via conductors. Solder-resist layer (70B) has openings (71B) which expose upper surfaces of the lowermost conductive layer and lowermost via conductors. Portions exposed from openings (71A, 71B) of solder-resist layers (70A, 70B) work as pads. The upper buildup layer has C4 pads (IP), and the lower buildup layer has BGA pads (MP). Solder bumps (C4 bumps) (76U) are formed on C4 pads, and solder bumps (BGA bumps) (76D) are formed on BGA pads.

FIG. 17(A) shows how to use a printed wiring board of the first embodiment. As shown in FIG. 17(A), IC chip 90 is mounted on printed wiring board 10 of the first embodiment. Usually, an IC chip is mounted on a printed wiring board through C4 bumps by a reflow process. IC chip 90 has silicon substrate (90s). Since the rigidity of silicon is high, it is thought that the IC chip does not warp at reflow temperature or that the amount of warping of the IC chip is small at mounting temperature. Also, the IC chip has electrodes 92 for connection with a printed wiring board (FIG. 17(B)).

To make it highly functional, distance (IK) between electrodes 92 of the IC chip is 150 μm or less. Distance (IK) is anticipated to be in a range of 60 μm to 120 μm in the future. It may become 100 μm or less. Distance (IK) is the distance from the center of an electrode to the center of its adjacent electrode (FIG. 17(B)). The distance between C4 pads is the same as distance (IK) between electrodes.

Figure 19:
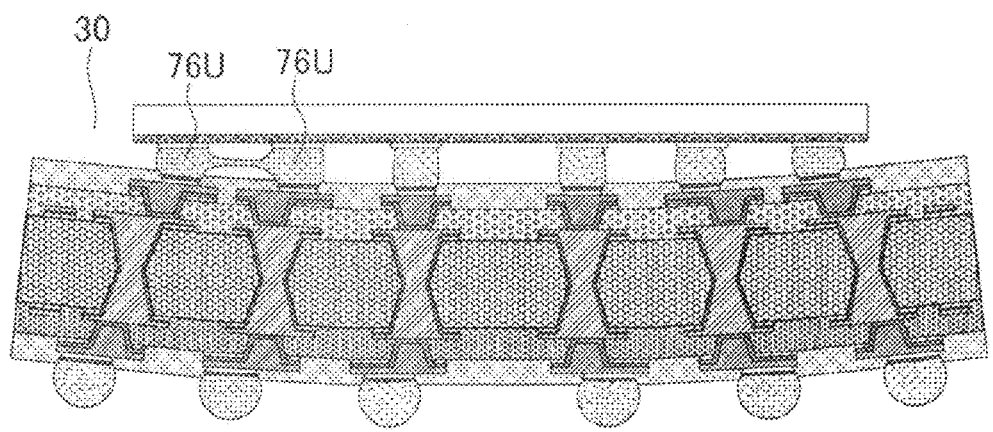
FIG. 19 is a view showing an example of short circuit between C4 bumps of a printed wiring board.

To prevent short circuiting of peripheral C4 bumps during first mounting, the thermal expansion coefficient of the uppermost interlayer resin insulation layer is set higher than that of the lowermost interlayer resin insulation layer in the first embodiment. Peripheral C4 pads are short circuited in FIG. 19. Short circuiting shown in FIG. 19 is prevented in the first embodiment.

Figure 16:
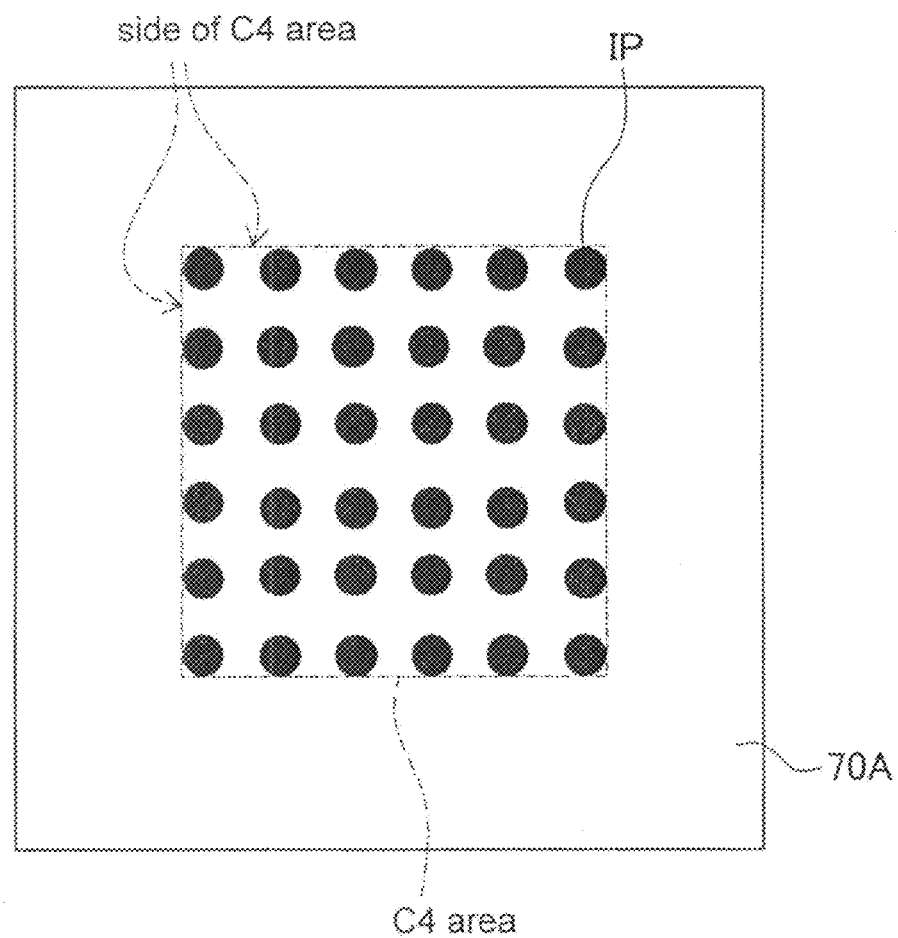
FIG. 16 is a plan view showing a C4 area.

Since the thermal expansion coefficient of the uppermost interlayer resin insulation layer is set higher than that of the lowermost interlayer resin insulation layer, the distance between peripheral C4 pads and peripheral electrodes of an IC chip becomes great at reflow temperature (mounting temperature). The C4 area and C4 pads are shown in FIG. 16. For the uppermost interlayer resin insulation layer and the lowermost interlayer resin insulation layer to have different thermal expansion coefficients, for example, it is an option to change the amount of inorganic particles or the amount of resin in the interlayer resin insulation layers. Alternatively, thermal expansion coefficients may also be set different by modifying the type and amount of reinforcing material in the interlayer resin insulation layers. When the amount (wt. %) of inorganic particles such as silica or the amount (wt. %) of reinforcing material such as glass cloth increases, or the amount (wt. %) of resin decreases, thermal expansion coefficients of interlayer resin insulation layers become lower. When the amounts of resin are different between interlayer resin insulation layers, the difference in the resin amount (wt. %) is preferred to be within 13 wt. %. When the uppermost and lowermost interlayer resin insulation layers contain the same type of glass cloth (glass cloth made of T-glass), the difference between the resin amount (wt. %) in the uppermost interlayer resin insulation layer and the resin amount (wt. %) in the lowermost interlayer resin insulation layer is preferred to be 7 wt. % or lower. For example, the resin amount in the lowermost interlayer resin insulation layer is 67 wt. % and the resin amount in the uppermost interlayer resin insulation layer is 73 wt. %. Peeling does not occur between the core substrate and the uppermost and lowermost interlayer resin insulation layers or between the later-described upper and lower interlayer resin insulation layers and the uppermost and lowermost interlayer resin insulation layers.

Also, when film thicknesses are different for different interlayer resin insulation layers, the difference in film thicknesses (μm) is preferred to be within 5 μm. It is easier to control warping of a printed wiring board. For example, the film thickness of the uppermost interlayer resin insulation layer is 30 μm, and the film thickness of the lowermost interlayer resin insulation layer is 35 μm. The film thickness of the lowermost interlayer resin insulation layer is preferred to be thinner than the film thickness of the uppermost interlayer resin insulation layer.

When thermal expansion coefficients of the uppermost and lowermost interlayer resin insulation layers are set different by the amount (wt. %) of reinforcing material or the amount (wt. %) of inorganic particles, the uppermost and lowermost interlayer resin insulation layers are preferred to contain inorganic particles of the same material. The reinforcing material in the uppermost and lowermost interlayer resin insulation layers may be the same or different. When using different materials, the thermal expansion coefficient of the reinforcing material in the uppermost interlayer resin insulation layer is preferred to be higher than that of the reinforcing material in the lowermost interlayer resin insulation layer. The reinforcing material in the lowermost interlayer resin insulation layer is glass cloth made of T-glass, and the reinforcing material in the uppermost interlayer resin insulation layer is glass cloth made of E-glass. Alternatively, the uppermost and lowermost interlayer resin insulation layers contain glass cloth made of T-glass, but the resin amounts (wt. %) are set different in the uppermost and lowermost interlayer resin insulation layers. This makes it easier to control warping.

When the thermal expansion coefficient of the uppermost interlayer resin insulation layer is divided by the thermal expansion coefficient of the lowermost interlayer resin insulation layer, obtained value (PU) is greater than 1 but 1.5 or smaller. Thermal expansion coefficients and value (PU) are preferred to be values at reflow temperature, and the reflow temperature is 220 degrees, for example. In the first embodiment, the distance between C4 pads formed in the center of the C4 area and IC chip electrodes corresponding to such pads is set shorter than the distance between C4 pads formed in the periphery of the C4 area and IC chip electrodes corresponding to such pads. Therefore, short circuiting is prevented between the peripheral C4 pads. The printed wiring board tends to warp in a shape shown in FIG. 18(B) at the mounting temperature for the first mounting. When a printed wiring board is placed on a flat board by setting the lower solder-resist layer of the printed wiring board to face the flat board, the printed wiring board warps at the temperature for the first mounting in such a way that the center of the printed wiring board bows upward (FIG. 18(B)). An IC chip is mounted on a printed wiring board during the first mounting.

When value (PU) is 1 or smaller, short circuiting tends to occur between the peripheral C4 bumps. When value (PU) exceeds 1.5, warping becomes too great in the printed wiring board, and the peripheral electrodes of the IC chip may fail to be connected to C4 pads of the printed wiring board, or the peripheral electrodes of the IC chip may be peeled from the printed wiring board due to stress while in use.

Value (PU) is preferred to be greater than 1.1 but smaller than 1.5. Connection resistance due to thermal stress while in use is prevented from increasing between the peripheral C4 pads and IC chip electrodes corresponding to those pads.

In the first embodiment, the thermal expansion coefficient (CTE) at 220 degrees of lowermost interlayer resin insulation layer (50B) is set lower than that of uppermost interlayer resin insulation layer (50A). The thermal expansion coefficient of the lowermost interlayer resin insulation layer is 8 ppm to 20 ppm, and the thermal expansion coefficient of the uppermost interlayer resin insulation layer is 15 ppm to 22 ppm. Each electrode of an IC chip and a C4 pad are connected at lower resistance. Moreover, the thermal expansion coefficient of lowermost interlayer resin insulation layer (50B) at 220 degrees is preferred to be 16 ppm or lower. Connection failure between the IC chip and the printed wiring board seldom occurs during a heat cycle.

Also, when the thermal expansion coefficient (CTE) of reinforcing material such as glass cloth in uppermost interlayer resin insulation layer (50A) is divided by the thermal expansion coefficient (CTE) of reinforcing material such as glass cloth in the lowermost interlayer resin insulation layer, obtained value (GU) is preferred to be 1.5 or greater but 2.5 or smaller. When value (GU) is within such a range and value (PU) is within the range described above, the strength of interlayer resin insulation layers increases. Cracking seldom occurs in interlayer resin insulation layers even when the printed wiring board warps.

When different reinforcing material is used in the uppermost and lowermost interlayer resin insulation layers, the thermal expansion coefficient of the reinforcing material in the uppermost interlayer resin insulation layer is 2 ppm to 4 ppm, and the thermal expansion coefficient of the reinforcing material in the lowermost interlayer resin insulation layer is 4 ppm to 6 ppm. Such thermal expansion coefficients are preferred to be values at 195 degrees to 280 degrees. This makes it easier to control warping of a printed wiring board at reflow temperature. Moreover, thermal expansion coefficients are preferred to be values at 195 degrees to 255 degrees. Defects such as warping or connection failure at high temperatures decrease.

In the first embodiment, warping occurs in a printed wiring board at reflow temperature. Thus, Young's modulus (tensile elasticity) of interlayer resin insulation layers at high temperatures is preferred to be at a predetermined value (range) in the first embodiment. For example, Young's modulus in a range of 195 degrees to 280 degrees is preferred to be a predetermined value (range). As for a specific temperature, Young's modulus at 260 degrees is important. Young's modulus is a value in X-Y directions shown in FIG. 6. Especially, when Young's modulus in a range of 195 degrees to 260 degrees is set to be in a predetermined range, cracking is unlikely to occur in interlayer resin insulation layers.

When Young's modulus of lowermost interlayer resin insulation layer (50B) is divided by Young's modulus of uppermost interlayer resin insulation layer (50A), obtained value (YU) is preferred to be 1.05 to 2. Peeling between an interlayer resin insulation layer and a solder-resist layer is prevented. Moreover, value (YU) is preferred to be 1.6 or smaller. Cracking during a heat cycle is unlikely to occur in interlayer resin insulation layers.

As for specific values, Young's modulus of the lowermost interlayer resin insulation layer is 13 GPa to 22 GPa, and Young's modulus of the uppermost interlayer resin insulation layer is 8 GPa to 16 GPa. Young's modulus of the lowermost interlayer resin insulation layer is preferred to be higher than that of the uppermost interlayer resin insulation layer, and higher than 15 GPa.

When Young's modulus of reinforcing material such as glass cloth in the lowermost interlayer resin insulation layer is divided by Young's modulus of reinforcing material in the uppermost interlayer resin insulation layer, obtained value (EU) is preferred to be 1.05 or greater but 1.2 or smaller. If value (EU) exceeds 1.2, cracking is thought to occur in uppermost interlayer resin insulation layer (50A). If value (EU) is smaller than 1.05, cracking is thought to occur in lowermost interlayer resin insulation layer (50B).

The printed wiring board of the first embodiment is suitable as a printed wiring board for mounting an IC chip with a thickness of 0.05 mm to 0.15 mm. When the thickness of an IC chip is less than 0.05 mm, warping of the IC chip at reflow temperature (mounting temperature) becomes a problem. Connection failure tends to occur between the IC chip and the printed wiring board. When the thickness of an IC chip exceeds 0.15 mm, the IC chip is heavy. If an IC chip is heavy, the IC chip tends to sink due to its own weight during a reflow process. Accordingly, there may be a risk of short circuiting between adjacent solder bumps (C4 bumps) when the pitch of C4 pads is set at 150 μm or shorter. Here, C4 bumps are solder bumps formed on pads (C4 pads) (IP) for mounting an IC chip, and are indicated as (76U) in FIG. 7. The pitch of C4 bumps is the distance between the center of a pad and the center of its adjacent pad.

C4 pads are formed in a predetermined rectangular region (C4 area) (FIG. 16). The short and long sides of the C4 area are determined to include all C4 pads while the size of the C4 area is set to be minimum. When the thickness of an IC chip exceeds 0.15 mm, short circuiting occurs between C4 bumps formed in the central portion of the C4 area.

C4 bumps formed in the periphery of the C4 area receive greater stress than central bumps. In the first embodiment, the distance between the peripheral C4 pads and IC chip electrodes corresponding to the pads is set longer than the distance between the central C4 pads and IC chip electrodes corresponding to the pads. Thus, connection reliability is enhanced between the IC chip and the printed wiring board. Each side of the C4 area of a printed wiring board in the first embodiment is preferred to be 8 mm to 15 mm. The size of the C4 area is almost the same as the size of an IC chip. If the length of a side is less than 8 mm, warping of an IC chip is less likely to cause a substantial problem at the time of reflow. If the length of a side exceeds 15 mm, the peripheral C4 pads will not be connected to electrodes of the IC chip.

As described above, warping of a printed wiring board is controlled at mounting temperature in the first embodiment. At reflow temperature, a printed wiring board warps in such a way that the central portion of the uppermost interlayer resin insulation layer becomes convex. The distance is secured between the peripheral C4 pads of the C4 area and IC chip electrodes corresponding to the pads. Thus, the mounting yield of IC chips is high. The connection reliability between the printed wiring board and the IC chip is enhanced against stress such as a heat cycle.

In the embodiment, the distance between the peripheral electrodes of an IC chip and the peripheral C4 pads of the C4 area is secured at mounting temperature. Accordingly, the mounting yield of IC chips is high. Also, the connection reliability of solder bumps (76U) is improved.

Each interlayer resin insulation layer of a printed wiring board in the embodiment is preferred to contain reinforcing material such as glass cloth. Even when warping occurs in the printed wiring board, cracking in interlayer resin insulation layers is prevented because of the reinforcing material. The length of each side of a printed wiring board is preferred to be 15 mm to 25 mm. If the length is less than 15 mm, warping of the printed wiring board is small at mounting temperature, causing short circuiting between the peripheral C4 bumps. If the length exceeds 25 mm, warping of a printed wiring board increases, causing connection failure between the peripheral C4 bumps and IC chip electrodes.

Method for Manufacturing a Printed Wiring Board of the First Embodiment

Figure 2:
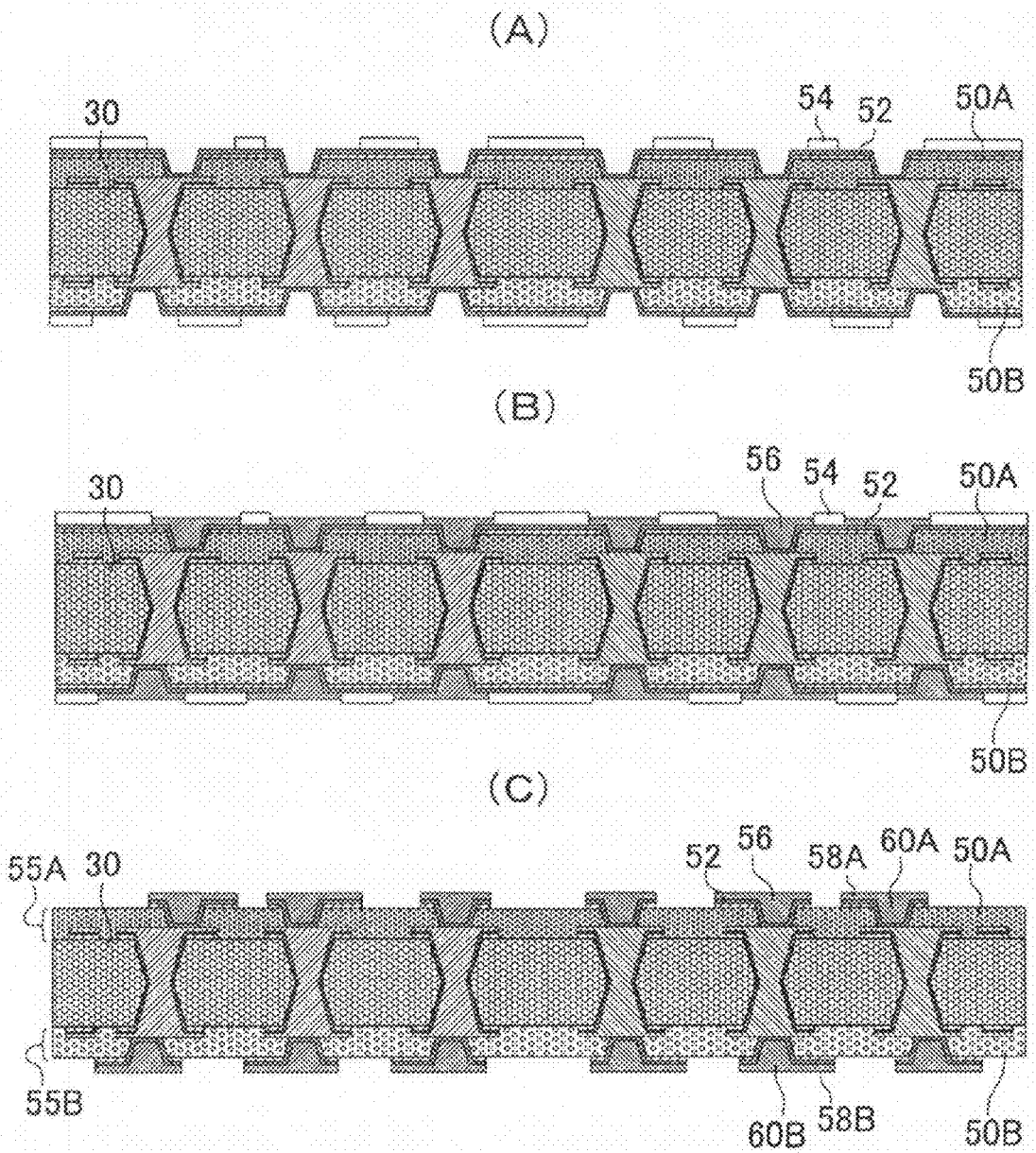
FIGS. 2(A)-2(C) are views of steps showing a method for manufacturing a printed wiring board according to the first embodiment.

FIGS. 1-3 show a method for manufacturing printed wiring board 10 of the first embodiment.

(1) Double-sided copper-clad laminate (30S) is prepared, using insulative substrate (30A) having first surface (F) and second surface (S) opposite the first surface and with metal foils (22, 22) laminated on both surfaces (FIG. 1(A)). As for a double-sided copper-clad laminate, ELC4785TH-G made by Sumitomo Bakelite Co., Ltd. may be used. Copper foils (22, 22) are respectively laminated on first surface (F) and second surface (S) of the insulative substrate.

The insulative substrate is made of resin and reinforcing material. As for reinforcing material, glass cloth, aramid fiber, glass fiber and the like are listed. As for resin, epoxy resin, BT (bismaleimide triazine) resin and the like are listed. Particles made of a hydroxide may further be contained in the resin. Particles made of a hydroxide may be those of metal hydroxides such as aluminum hydroxide, magnesium hydroxide, calcium hydroxide, barium hydroxide or the like. When hydroxides are heated, water is generated. Therefore, hydroxides are thought to take heat from the material in core substrate 30. Namely, when insulative substrate (30A) contains a hydroxide, the result of laser processing is thought to improve.

(2) Core substrate 30 is completed when double-sided copper-clad laminate (30S) is processed (FIG. 1(B)). The first surface of the core substrate corresponds to the first surface of the insulative substrate, and the second surface of the core substrate corresponds to the second surface of the insulative substrate. Core substrate 30 may be manufactured by the method described in U.S. Pat. No. 7,786,390.

(3) On first surface (F) of core substrate 30, prepreg that contains glass cloth made of E-glass, inorganic particles such as silica and thermosetting resin such as epoxy along with metal foil (copper foil) 48 are laminated in that order. On second surface (S) of core substrate 30, prepreg that contains glass cloth made of T-glass, inorganic particles such as silica and thermosetting resin such as epoxy along with metal foil (copper foil) 48 are laminated in that order. Then, thermal pressing is conducted to form uppermost interlayer resin insulation layer (50A) and lowermost interlayer resin insulation layer (50B) from the prepreg, and to bond copper foils 48 to the interlayer resin insulation layers (FIG. 1(C)).

The thickness of interlayer resin insulation layer (50B) is 30 μm to 50 μm, and it is set at 35 μm in the embodiment. The thermal expansion coefficient of interlayer resin insulation layer (50B) at 220 degrees is approximately 8.5 ppm. The thickness of interlayer resin insulation layer (50A) is 30 μm to 50 μm, and it is set at 35 μm in the embodiment. The thermal expansion coefficient of interlayer resin insulation layer (50A) at 220 degrees is approximately 12.1 ppm. Thermal expansion coefficients are controlled by the type and amount of reinforcing material, resin and inorganic particles contained in interlayer resin insulation layers. In the example, amounts (wt. %) of reinforcing material, inorganic particles and resin are the same in the uppermost and lowermost interlayer resin insulation layers.

(4) Next, openings (51A, 51B) for via conductors are respectively formed in interlayer resin insulation layers (50A, 50B) using a $CO_2$ gas laser (FIG. 1(D)).

(5) Electroless plated films (52, 52) are formed on copper foils 48 and on the inner walls of openings (51A, 51B) (FIG. 1(E)).

(6) Plating resist 54 is formed on electroless plated film 52 (FIG. 2(A)).

(7) Electrolytic plated film 56 is formed on electroless plated film 52 exposed from plating resist 54 (FIG. 2(B))

(8) Plating resist 54 is removed. Electroless plated film and metal foil between portions of electrolytic plated film are etched away to form uppermost and lowermost conductive layers (58A, 58B) and uppermost and lowermost via conductors (60A, 60B) (FIG. 2(C)). The uppermost and lowermost conductive layers include multiple conductive circuits and via lands surrounding via conductors. Upper and lower buildup layers (55A, 55B) are formed.

(9) Upper solder-resist layer (70A) having openings (71A) is formed on the upper buildup layer, and lower solder-resist layer (70B) having openings (71B) is formed on the lower buildup layer (FIG. 3(A)). Upper surfaces of the uppermost conductive layer and uppermost via conductors exposed from openings (71A) work as C4 pads (IP), and upper surfaces of the lowermost conductive layer and lowermost via conductors exposed from openings (71B) work as BGA pads (MP).

(10) Nickel-plated layer 72 is formed on pads (IP, MP), and gold-plated layer 74 is further formed on nickel-plated layer 72 (FIG. 3(B)). Instead of nickel-gold layers, nickel-palladium-gold layers may also be formed.

(11) Then, solder balls are loaded on pads (IP, MP) and a reflow is conducted to form C4 bumps (76U) on C4 pads and BGA bumps (76D) on BGA pads. Printed wiring board 10 is completed (FIG. 7).

Figure 5:
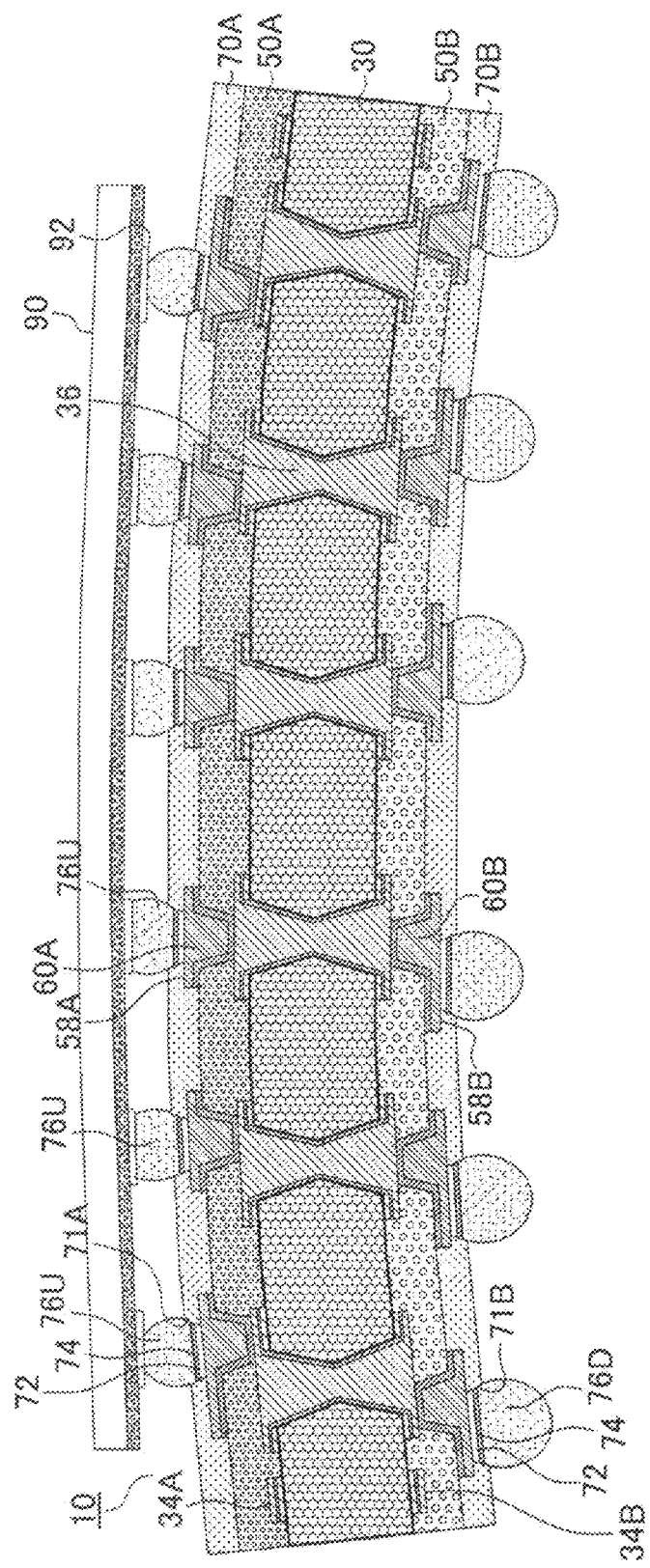
FIG. 5 is a view schematically showing warping of a printed wiring board of the first embodiment at reflow temperature.

(12) IC chip electrodes 92 are aligned with C4 bumps (76U) and a reflow is conducted. Accordingly, IC chip 90 is mounted on printed wiring board 10 (FIG. 5). As shown in FIG. 5, the printed wiring board warps at reflow temperature. When the printed wiring board is placed on a flat board by setting the lower solder-resist layer to face downward, the printed wiring board warps in such a way that the center of the printed wiring board bows upward. Thus, using a printed wiring board of the embodiment, the peripheral C4 bumps do not short circuit even when the printed wiring board warps at reflow temperature, resulting in a high mounting yield of IC chips. Also, the connection reliability of C4 bumps (76U) is improved.

(13) Then, the printed wiring board is mounted on a motherboard through BGA bumps (76D) (not shown in drawings).

Second Embodiment

Figure 4:
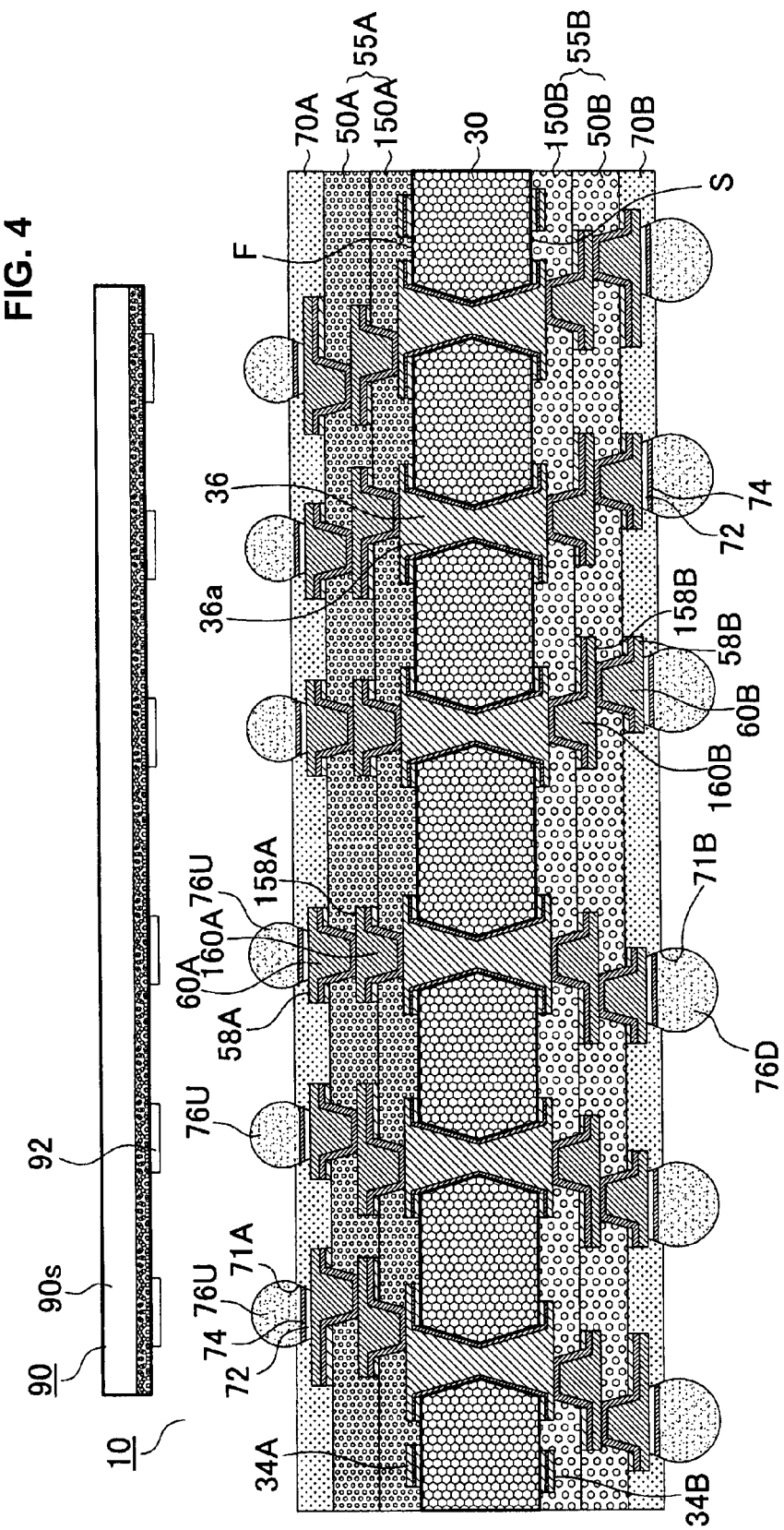
FIG. 4 is a cross-sectional view of an IC chip and a printed wiring board according to a second embodiment.

FIG. 4 shows printed wiring board 10 according to a second embodiment. In the first embodiment, upper and lower buildup layers are each single layered. By contrast, upper and lower buildup layers of the printed wiring board are double layered in the second embodiment. Accordingly, upper interlayer resin insulation layer (150A) is formed on the first surface of the core substrate and on first conductive layer in the second embodiment. Then, upper conductive layer (158A) is formed on the upper interlayer resin insulation layer, and the upper conductive layer is connected to the first conductive layer and through-hole conductors by upper via conductors (160A) penetrating through the upper interlayer resin insulation layer. Uppermost interlayer resin insulation layer (50A) is formed on the upper interlayer resin insulation layer and upper conductive layer. Uppermost conductive layer (58A) is formed on the uppermost interlayer resin insulation layer, and the uppermost conductive layer is connected to the upper conductive layer and upper via conductors by uppermost via conductors (60A) penetrating through the uppermost interlayer resin insulation layer. Upper buildup layer (55A) is made up of upper and uppermost interlayer resin insulation layers formed on the core substrate, upper and uppermost conductive layers and upper and uppermost via conductors.

Also, lower interlayer resin insulation layer (150B) is formed on the second surface of the core substrate and on the second conductive layer. Then, lower conductive layer (158B) is formed on the lower interlayer resin insulation layer, and the lower conductive layer is connected to the second conductive layer and through-hole conductors by lower via conductors (160B) penetrating through the lower interlayer resin insulation layer. Lowermost interlayer resin insulation layer (50B) is formed on the lower interlayer resin insulation layer and lower conductive layer. Lowermost conductive layer (58B) is formed on the lowermost interlayer resin insulation layer, and the lowermost conductive layer is connected to the lower conductive layer and lower via conductors by lowermost via conductors (60B) penetrating through the lowermost interlayer resin insulation layer. Lower buildup layer (55B) is made up of lower and lowermost interlayer resin insulation layers formed on the core substrate, lower and lowermost conductive layers and lower and lowermost via conductors. Each conductive layer includes multiple conductive circuits and via lands formed around via conductors.

An upper solder-resist layer having openings (71A) is formed on the upper buildup layer. The uppermost conductive layer and uppermost via conductors exposed from openings (71A) work as C4 pads (IP). Lower solder-resist layer (70B) having openings (71B) is formed on the lower buildup layer. The lowermost conductive layer and lowermost via conductors exposed from openings (71B) work as BGA pads (MP). Nickel film 74 and gold film 72 are formed in that order on pads (IP, MP). Then, solder bumps (C4 bumps) (76U) are formed on C4 pads, and solder bumps (BGA bumps) (76D) are formed on BGA pads.

The same as in the first embodiment, the thermal expansion coefficient of the uppermost interlayer resin insulation layer is set higher than that of the lowermost interlayer resin insulation layer in the printed wiring board of the second embodiment. The printed wiring board of the second embodiment warps in the same way as the printed wiring board of the first embodiment at reflow temperature. Uppermost and lowermost interlayer resin insulation layers in the second embodiment are the same as the uppermost and lowermost interlayer resin insulation layers in the first embodiment. The contents described in paragraphs 10 through 25 in the first embodiment apply to the printed wiring board of the second embodiment. The thickness of the mounted IC chip, the size of the C4 area and the size of the printed wiring board are the same in the first and second embodiment and in each example and modified example described later. The printed wiring board of the second embodiment has the same effects as the printed wiring board of the first embodiment.

Method for Manufacturing a Printed Wiring Board of the Second Embodiment

A printed wiring board of the second embodiment is manufactured by the same method as for the first embodiment. By twice repeating step (3) in paragraph 34 through step (7) in paragraph 39, double-layered buildup layers are formed on the core substrate.

Modified Example 1 of the Second Embodiment

Upper and lower buildup layers of modified Example 1 of the second embodiment are also double layered the same as in the second embodiment. The thermal expansion coefficient of the uppermost interlayer resin insulation layer is set higher than that of the lowermost interlayer resin insulation layer. Moreover, thermal expansion coefficients of upper and lower interlayer resin insulation layers are set the same. In this example, since thermal expansion coefficients of upper and lower interlayer resin insulation layers are the same, warping of the printed wiring board is controlled by thermal expansion coefficients of the uppermost and lowermost interlayer resin insulation layers even with the double-layered buildup layers. In modified Example 1 of the second embodiment, a high-functional IC chip can be mounted on the printed wiring board, making it relatively easy to control warping.

The contents described in paragraphs 10 through 25 in the first embodiment apply to the uppermost and lowermost inter-layer resin insulation layers of the printed wiring board in modified Example 1 of the second embodiment. The printed wiring board in modified Example 1 of the second embodiment has the same effects as the printed wiring board of the first embodiment. Shown below are examples (I, II, III) of the printed wiring board in modified Example 1 of the second embodiment.

(I) The thermal expansion coefficients of the upper and lower interlayer resin insulation layers are set higher than the thermal expansion coefficient of the lowermost interlayer resin insulation layer, but lower than the thermal expansion coefficient of the uppermost interlayer resin insulation layer. For example, each interlayer resin insulation layer is made of the same type of reinforcing material and resin; the amount (wt. %) of reinforcing material in the lowermost interlayer resin insulation layer is greater than those in the other interlayer resin insulation layers; and the amounts (wt. %) of reinforcing material in the upper and lower interlayer resin insulation layers are the same, which are greater than that in the uppermost interlayer resin insulation layer. The film thickness of each interlayer resin insulation layer is approximately the same.

In this example, the thermal expansion coefficient of the lowermost interlayer resin insulation layer is 8 ppm~16 ppm, the thermal expansion coefficients of the upper and lower interlayer resin insulation layers are 12~18 ppm, and the thermal expansion coefficient of the uppermost interlayer resin insulation layer is 15 ppm~22 ppm. When the thermal expansion coefficient of the uppermost interlayer resin insulation layer is divided by the thermal expansion coefficient of the upper interlayer resin insulation layer, or when the thermal expansion coefficient of the upper interlayer resin insulation layer is divided by the thermal expansion coefficient of the lowermost interlayer resin insulation layer, the obtained values are 1.05~1.3. Thermal expansion coefficients are preferred to be values at 195 degrees to 280 degrees, more preferably at 195 degrees to 255 degrees. Defects such as warping and connection failure decrease at high temperatures.

Young's moduli of upper and lower interlayer resin insulation layers are preferred to be lower than Young's modulus of the lowermost interlayer resin insulation layer but higher than Young's modulus of the uppermost interlayer resin insulation layer. Young's modulus of the lowermost interlayer resin insulation layer is 15 GPa to 22 GPa, Young's modulus of the uppermost interlayer resin insulation layer is 8 GPa to 16 GPa, and Young's moduli of the upper and lower interlayer resin insulation layers are 10 GPa to 18 GPa.

When Young's modulus of the lowermost interlayer resin insulation layer is divided by Young's modulus of the upper interlayer resin insulation layer, or when Young's modulus of the upper interlayer resin insulation layer is divided by Young's modulus of the uppermost interlayer resin insulation layer, obtained values are preferred to be 1.02 to 1.6.

In this example, since interlayer resin insulation layers are well balanced on the upper and lower surfaces of the core substrate, defects such as cracking caused by repeated warping seldom occur in the printed wiring board. In addition, cracking is unlikely to occur in interlayer resin insulation layers while connection reliability is secured between the IC chip and the printed wiring board.

(II) Thermal expansion coefficients of the lowermost, upper and lower interlayer resin insulation layers are the same. For example, each interlayer resin insulation layer is made of the same type of reinforcing material and resin, and the amounts (wt. %) of reinforcing material in the lowermost, upper and lower interlayer resin insulation layers are the same, which are greater than the amount of reinforcing material in the uppermost interlayer resin insulation layer. The film thickness of each interlayer resin insulation layer is approximately the same. For example, glass cloth in the lowermost, upper and lower interlayer resin insulation layers is made of T-glass, and glass cloth in the uppermost interlayer resin insulation layer is made of E-glass. Alternatively, all the interlayer resin insulation layers contain glass cloth made of T-glass, and the resin amounts (wt. %) in the lowermost, upper and lower interlayer resin insulation layers are set less than the resin amount (wt. %) in the uppermost interlayer resin insulation layer.

In this example, the thermal expansion coefficient of the lowermost interlayer resin insulation layer is 8 ppm to 20 ppm, and the thermal expansion coefficient of the uppermost interlayer resin insulation layer is 15 ppm to 22 ppm. Thermal expansion coefficients are preferred to be values at 195 degrees to 280 degrees, more preferably at 195 degrees to 255 degrees. Defects such as warping and connection failure at high temperatures are reduced. Young's modulus of the uppermost interlayer resin insulation layer is 8 GPa to 16 GPa. Young's moduli of the upper and lower interlayer resin insulation layers are the same as Young's modulus of the lowermost interlayer resin insulation layer described in the first embodiment, which is 13 GPa to 22 GPa. Cracking is unlikely to occur in interlayer resin insulation layers while connection reliability is secured between the IC chip and the printed wiring board.

(III) Thermal expansion coefficients of the uppermost, upper and lower interlayer resin insulation layers are the same. For example, each interlayer resin insulation layer is made of the same type of reinforcing material and resin, the amount (wt. %) of reinforcing material in the lowermost interlayer resin insulation layer is greater than in the other interlayer resin insulation layers, and the amounts (wt. %) of reinforcing material are the same in the upper, lower and uppermost interlayer resin insulation layers. The film thickness of each interlayer resin insulation layer is approximately the same. For example, glass cloth in the uppermost, upper and lower interlayer resin insulation layers is made of E-glass, and glass cloth in the lowermost interlayer resin insulation layer is made of T-glass. Alternatively, all the interlayer resin insulation layers contain glass cloth made of T-glass, and the resin amounts (wt. %) in the uppermost, upper and lower interlayer resin insulation layers are set greater than the resin amount (wt. %) in the lowermost interlayer resin insulation layer.

In this example, the thermal expansion coefficient of the lowermost interlayer resin insulation layer is 8 ppm to 20 ppm, and the thermal expansion coefficient of the uppermost interlayer resin insulation layer is 15 ppm to 22 ppm. Thermal expansion coefficients are preferred to be values at 195 degrees to 280 degrees, more preferably at 195 degrees to 255 degrees. Defects such as warping and connection failure at high temperatures are reduced.

Young's moduli of the upper and lower interlayer resin insulation layers are the same as Young's modulus of the uppermost interlayer resin insulation layer described in the first embodiment, which is 8 GPa to 16 GPa. Young's modulus of the lowermost interlayer resin insulation layer is 13 GPa to 22 GPa. Cracking is unlikely to occur in interlayer resin insulation layers while connection reliability is secured between the IC chip and the printed wiring board.

When the printed wiring board in (II) is compared with the printed wiring board in (III) above, the thermal expansion coefficient of the printed wiring board in (III) is higher than that of the printed wiring board in (II). Using the printed wiring board in (II), C4 bumps are seldom damaged in heat cycles during use. Also, the amount of warping of the printed wiring board is small at room temperature. Using the printed wiring board in (III), BGA bumps are seldom damaged in heat cycles during use.

Modified Example 2 of the Second Embodiment

The same as in the second embodiment, upper and lower buildup layers are double layered in modified Example 2 of the second embodiment. The thermal expansion coefficient of the uppermost interlayer resin insulation layer is higher than that of the lowermost interlayer resin insulation layer. Moreover, the thermal expansion coefficient of each interlayer resin insulation layer changes from the lowermost interlayer resin insulation layer toward the uppermost interlayer resin insulation layer. In this example, the difference is greater between the thermal expansion coefficient of the upper buildup layer and the thermal expansion coefficient of the lower buildup layer. Thus, when the printed wiring board of the first embodiment is compared with the printed wiring board in modified Example 2 of the second embodiment, the amount of warping at mounting temperature is greater in the printed wiring board in modified Example 2 of the second embodiment. The printed wiring board in modified Example 2 of the second embodiment is suitable as a printed wiring board for mounting a small IC chip. The contents described in paragraphs 10 through 25 in the first embodiment apply to the uppermost and lowermost interlayer resin insulation layers of the printed wiring board in modified Example 2 of the second embodiment.

The printed wiring board in modified Example 2 of the second embodiment has the same effects as the printed wiring board of the first embodiment. Shown below are examples (IV, V) of the printed wiring board in modified Example 2 of the second embodiment.

(IV) The thermal expansion coefficient of the uppermost interlayer resin insulation layer is higher than that of the upper interlayer resin insulation layer, the thermal expansion coefficient of the upper interlayer resin insulation layer is higher than that of the lower interlayer resin insulation layer, and the thermal expansion coefficient of the lower interlayer resin insulation layer is higher than that of the lowermost interlayer resin insulation layer. Thermal expansion coefficients of interlayer resin insulation layers change in the order described above.

For example, each interlayer resin insulation layer is formed using the same type of reinforcing material and resin; the amount (wt. %) of reinforcing material in the lowermost interlayer resin insulation layer is greater than in the other interlayer resin insulation layers; the amount (wt. %) of reinforcing material in the lower interlayer resin insulation layer is greater than in the upper and uppermost interlayer resin insulation layers; and the amount (wt. %) of reinforcing material in the upper interlayer resin insulation layer is greater than in the uppermost interlayer resin insulation layer. For example, glass cloth in the lowermost and lower interlayer resin insulation layers is made of T-glass, and glass cloth in the uppermost and upper interlayer resin insulation layers is made of E-glass. Then, the resin amounts (wt. %) in the lowermost and lower interlayer resin insulation layers are set different, and the resin amounts (wt. %) in the uppermost and upper interlayer resin insulation layers are set different. Alternatively, all the interlayer resin insulation layers contain glass cloth made of T-glass, and the resin amounts (wt. %) in the interlayer resin insulation layers are reduced from the uppermost interlayer resin insulation layer toward the lowermost interlayer resin insulation layer.

In this example, since the thermal expansion coefficient of each interlayer resin insulation layer changes in the order described above, stress caused by warping seldom concentrates in a specific interlayer resin insulation layer. Thus, even if the amount of warping is great, cracking seldom occurs in interlayer resin insulation layers.

When value (YU) is in the above range, Young's modulus of the lower interlayer resin insulation layer is preferred to be higher than that of the upper interlayer resin insulation layer. Variations in warping of printed wiring boards decrease. When value (YU) is in the above range, and when Young's modulus of lower interlayer resin insulation layer (150B) is divided by Young's modulus of upper interlayer resin insulation layer (150A), obtained value (YL) is preferred to be 1.05 to 2. Cracking is unlikely to occur in the printed wiring board even with a greater amount of warping of the printed wiring board. Moreover, value (YL) is preferred to be 1.6 or smaller. Cracking is unlikely to occur in interlayer resin insulation layers while connection reliability is secured between the IC chip and the printed wiring board.

When value (EU) is in the above range, and when Young's modulus of reinforcing material such as glass cloth in the lower interlayer resin insulation layer is divided by Young's modulus of reinforcing material in the upper interlayer resin insulation layer, obtained value (EL) is preferred to be 1.05 or greater but 1.2 or smaller. Cracking is unlikely to occur in upper and lower buildup layers.

(V) The thermal expansion coefficient of the lowermost interlayer resin insulation layer is the same as that of the lower interlayer resin insulation layer, and the thermal expansion coefficient of the upper interlayer resin insulation layer is the same as that of the uppermost interlayer resin insulation layer. Thermal expansion coefficients of interlayer resin insulation layers change in stages. For example, each interlayer resin insulation layer is made of the same type of reinforcing material and resin, the amounts (wt. %) of reinforcing material in the lowermost and lower interlayer resin insulation layers are the same, and the amounts (wt. %) of reinforcing material in the upper and uppermost interlayer resin insulation layers are the same. Then, the amount (wt. %) of reinforcing material in the lowermost interlayer resin insulation layer is set greater than the amount (wt. %) of reinforcing material in the uppermost interlayer resin insulation layer. For example, glass cloth in the uppermost and upper interlayer resin insulation layers is made of E-glass, and glass cloth in the lowermost and lower interlayer resin insulation layers is made of T-glass. Alternatively, all the interlayer resin insulation layers contain glass cloth made of T-glass, and the resin amounts (wt. %) in the uppermost and upper interlayer resin insulation layers are set greater than in the lowermost and lower interlayer resin insulation layers.

In this example, the thermal expansion coefficient of the lowermost interlayer resin insulation layer is 8 ppm to 16 ppm, and the thermal expansion coefficient of the uppermost interlayer resin insulation layer is 15 ppm to 22 ppm.

In this example, thermal expansion coefficients of the upper and uppermost interlayer resin insulation layers are the same, and thermal expansion coefficients of the lower and lowermost interlayer resin insulation layers are the same. Thus, interlayer resin insulation layers seldom peel in the upper and lower buildup layers.

When value (YU) is in the above range, and when Young's modulus of lower interlayer resin insulation layer (150B) is divided by Young's modulus of upper interlayer resin insulation layer (150A), obtained value (YL) is preferred to be 1.05 to 2. Cracking is unlikely to occur in the printed wiring board even with a great amount of warping of the printed wiring board. Young's modulus of the lower interlayer resin insulation layer is 13 GPa to 22 GPa, and Young's modulus of the upper interlayer resin insulation layer is 8 GPa to 16 GPa. In this example, warping of the printed wiring board is great, but cracking is unlikely to occur in each interlayer resin insulation layer.

Young's modulus of the lower interlayer resin insulation layer is preferred to be higher than that of the upper interlayer resin insulation layer, and is preferred to be 15 GPa or higher.

A printed wiring board in modified Example 2 of the second embodiment during the reflow process shows a greater amount of warping than printed wiring boards of the first embodiment, the second embodiment and modified Example 1 of the second embodiment. Thus, the printed wiring board in modified Example 2 of the second embodiment is suitable as a printed wiring board for mounting an IC chip with a thickness of 0.1 mm to 0.15 mm. Mounting yield and connection reliability are enhanced even when printed wiring boards warp.

Printed wiring boards of the first embodiment, the second embodiment and modified Example 1 of the second embodiment are suitable as printed wiring boards for mounting IC chips with a thickness of 0.05 mm to 0.1 mm. Mounting yield and connection reliability are enhanced even when printed wiring boards warp.

In modified Example 2 of the second embodiment, when the thermal expansion coefficient of the upper interlayer resin insulation layer is divided by the thermal expansion coefficient of the lower interlayer resin insulation layer, obtained value (PL) is preferred to be in a predetermined range. Variations in the amounts of warping decrease. Value (PL) is preferred to be obtained at reflow temperature, which is at 220 degrees, for example.

It is preferred that value (PU) be in the above-described range, and that value (PL) be greater than 1 but smaller than 1.5. The mounting yield of IC chips improves even when printed wiring boards are large. Moreover, value (PL) is preferred to be greater than 1.1 but smaller than 1.5. Even if printed wiring boards are large, connection reliability is enhanced between a printed wiring board and an IC chip.

The length of a side of the printed wiring board in modified Example 2 of the second embodiment may also be 18 mm or longer but 25 mm or shorter, for example. Even if the size of a printed wiring board is large, short circuiting seldom occurs between peripheral C4 bumps. In addition, when values (PU, PL) are in the above ranges, even when an IC chip with a thickness of 0.1 mm to 0.15 mm is mounted on a printed wiring board, connection reliability is high between the printed wiring board and the IC chip.

In modified Example 2 of the second embodiment, the thermal expansion coefficient of the lower interlayer resin insulation layer at 220° C. is preferred to be 16 ppm or lower. Connection failure seldom occurs between the printed wiring board and the IC chip while in use.

To set value (PL) within the above range, when the thermal expansion coefficient of reinforcing material in the upper interlayer resin insulation layer is divided by the thermal expansion coefficient of reinforcing material of the lower interlayer resin insulation layer, obtained value (GL) is preferred to be 1.5 or greater but 2.5 or smaller in modified Example 2 of the second embodiment. If value (GL) is in such a range, the strength of interlayer resin insulation layers is enhanced. Even when the printed wiring board warps, cracking seldom occurs in the interlayer resin insulation layers.

First Example

FIG. 4 is a cross-sectional view of a printed wiring board of a first example. In a printed wiring board of the first example, lowermost interlayer resin insulation layer (50B) contains glass cloth made of T-glass. The other interlayer resin insulation layers (upper interlayer resin insulation layer, uppermost interlayer resin insulation layer, lower interlayer resin insulation layer) contain glass cloth made of E-glass. The thermal expansion coefficient of the lowermost interlayer resin insulation layer is approximately 8.5 ppm, and the thermal expansion coefficients of the other interlayer resin insulation layers (upper interlayer resin insulation layer, uppermost interlayer resin insulation layer, lower interlayer resin insulation layer) are approximately 12.1 ppm.

The lowermost interlayer resin insulation layer has lower CTE than the other interlayer resin insulation layers (upper interlayer resin insulation layer, uppermost interlayer resin insulation layer, lower interlayer resin insulation layer).

Second Example

FIG. 7 shows a printed wiring board according to a second example. In the printed wiring board of the second example, upper and lower buildup layers are single layered.

The uppermost and lowermost interlayer resin insulation layers contain glass cloth of the same type. Glass cloth in the second example is made of T-glass. Thicknesses of the uppermost and lowermost interlayer resin insulation layers are the same, at 35 µm. The resin amount (wt. %) in the uppermost interlayer resin insulation layer is greater than the resin amount (wt. %) in the lowermost interlayer resin insulation layer. The amount (wt. %) of reinforcing material in the lowermost interlayer resin insulation layer is greater than the amount (wt. %) of reinforcing material in the uppermost interlayer resin insulation layer. Therefore, the thermal expansion coefficient of the lowermost interlayer resin insulation layer is lower than that of the uppermost interlayer resin insulation layer. Also, Young's modulus of the uppermost interlayer resin insulation layer is lower than that of the lowermost interlayer resin insulation layer.

In the second example, the resin amount in the lowermost interlayer resin insulation layer is approximately 67 wt. %, and the resin amount in the uppermost interlayer resin insulation layer is approximately 73 wt. %. At 220 degrees, the CTE of the lowermost interlayer resin insulation layer is approximately 9 ppm and the CTE of the uppermost interlayer resin insulation layer is approximately 13 ppm.

At 260 degrees, Young's modulus of the lowermost interlayer resin insulation layer is approximately 19 GPa and Young's modulus of the uppermost interlayer resin insulation layer is approximately 15 GPa.

Third Embodiment

Figure 9:
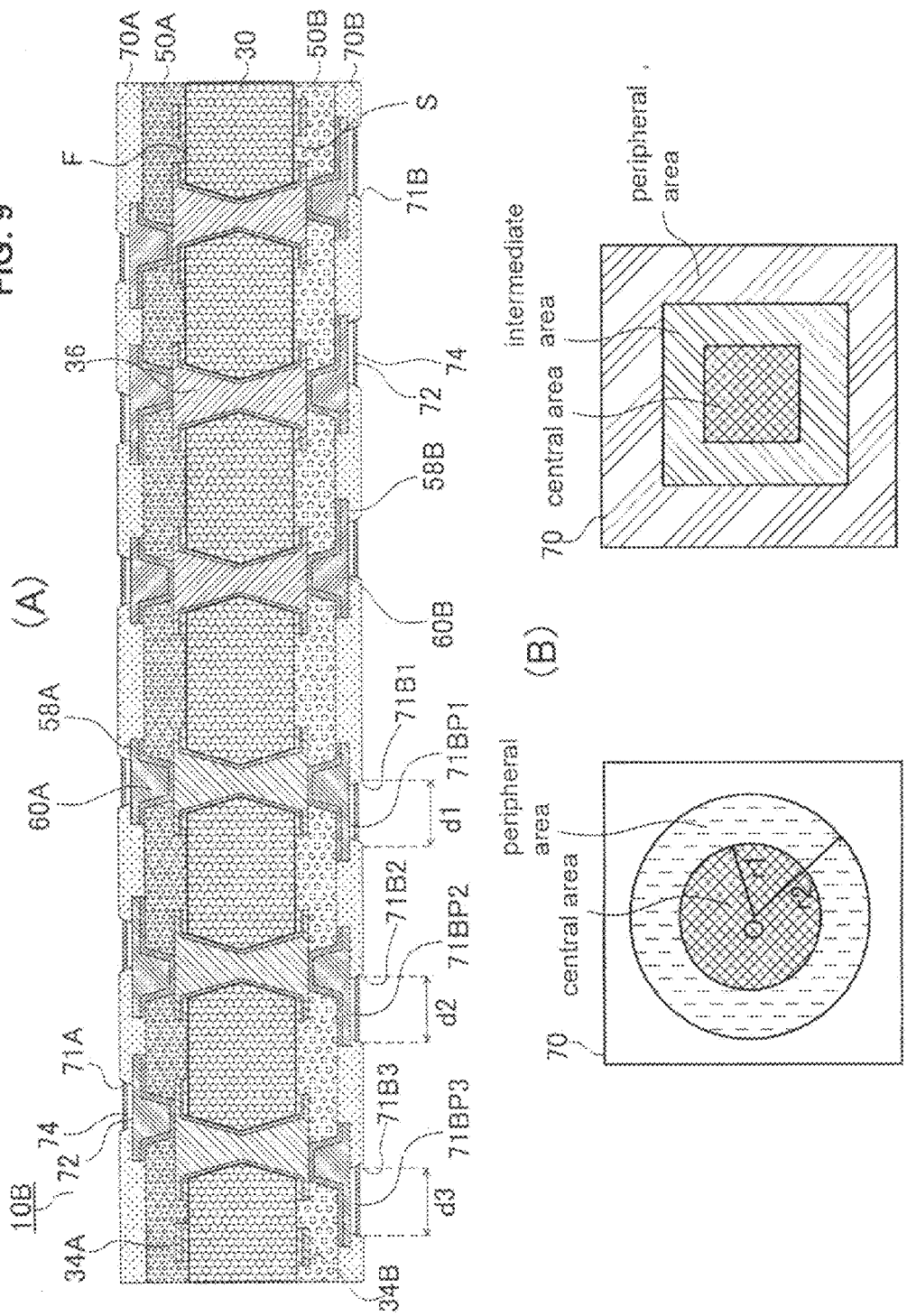
FIG. 9(A) is a view showing openings in a lower solder-resist layer of a printed wiring board according to the third embodiment.
FIG. 9(B) are plan views of the lower solder-resist layer.

FIG. 9(A) shows printed wiring board (10B) having solder-resist layers. The core substrate and upper and lower buildup layers of printed wiring board (10B) are the same as in the first embodiment.

Openings (71B) of different sizes are formed in lower solder-resist layer (70B). The size of openings (71B) increases from the center of the printed wiring board toward the periphery. The size of BGA pads increases from the center of the printed wiring board toward the periphery. The printed wiring board of the third embodiment has three types of openings (71B1, 71B2, 71B3). The opening size is different in openings (first openings) (71B1), openings (second openings) (71B2) and openings (third openings) (71B3). The size of openings (71B1) is smaller than that of openings (71B2), and the size of openings (71B2) is smaller than that of openings (71B3). Openings (71B1) are formed in the central region of the printed wiring board, openings (71B3) are formed in the peripheral region of the printed wiring board, and openings (71B2) are formed in the intermediate region between the central region and the peripheral region. Since a BGA pad is in a portion exposed from opening (71B), the printed wiring board of the third embodiment has BGA pads of different sizes. BGA pads are divided into multiple regions (areas), and the size of BGA pads in each region (area) is the same. FIG. 9(B) shows plan views of the lower solder-resist layer. BGA pads are divided into multiple areas.

In the third embodiment, size (d1) of openings (71B1) is 230 µm, size (d2) of openings (71B2) is 240 µm, and size (d3) of openings (71B3) is 250 µm. Opening sizes in adjacent regions are different by 7 µm to 15 µm. In the third embodiment, opening sizes in adjacent regions are different by 10 µm. The size of BGA pads increases in stages or gradually from the center of the printed wiring board toward the periphery.

Figure 10:
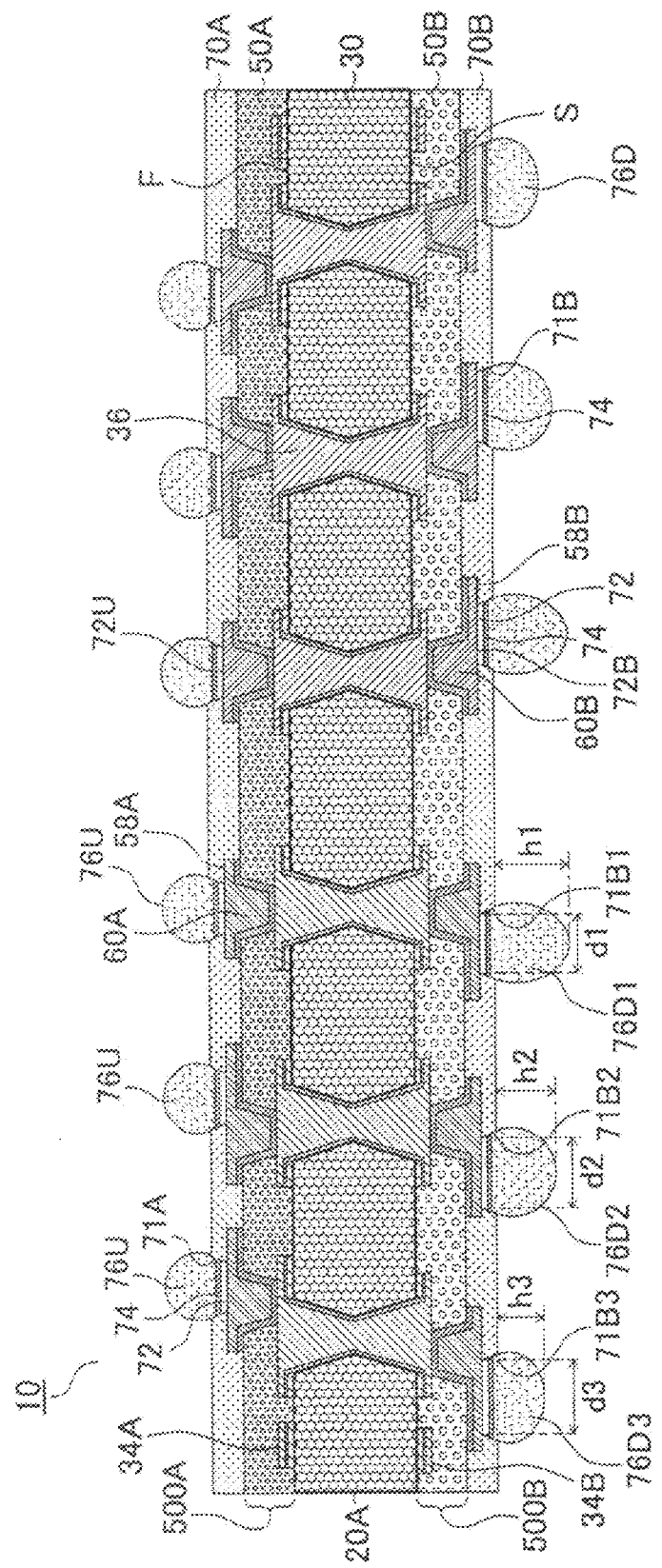
FIG. 10 is a cross-sectional view of a printed wiring board with solder bumps according to the third embodiment.

In the printed wiring board shown in FIG. 9(A), C4 bumps and BGA bumps are formed (FIG. 10). Since the sizes of BGA pads are different while volumes of BGA bumps (76D) are the same, the heights of BGA bumps are different. The height of BGA bumps decreases from the center of the printed wiring board toward the periphery. The height of BGA bumps decreases in stages from the central region toward the peripheral region. The conductor exposed from opening (71B1) is first BGA pad (71BP1), the conductor exposed from opening (71B2) is second BGA pad (71BP2), and the conductor exposed from opening (71B3) is third BGA pad (71BP3).

In the third embodiment, height (h1) of BGA bumps (first BGA bumps) (76D1) on first BGA pads is 150 µm, height (h2) of BGA bumps (second BGA bumps) (76D2) on second BGA pads is 140 µm, and height (h3) of BGA bumps (third BGA bump) (76D3) on third BGA pads is 130 µm (FIG. 10).

Figure 11:
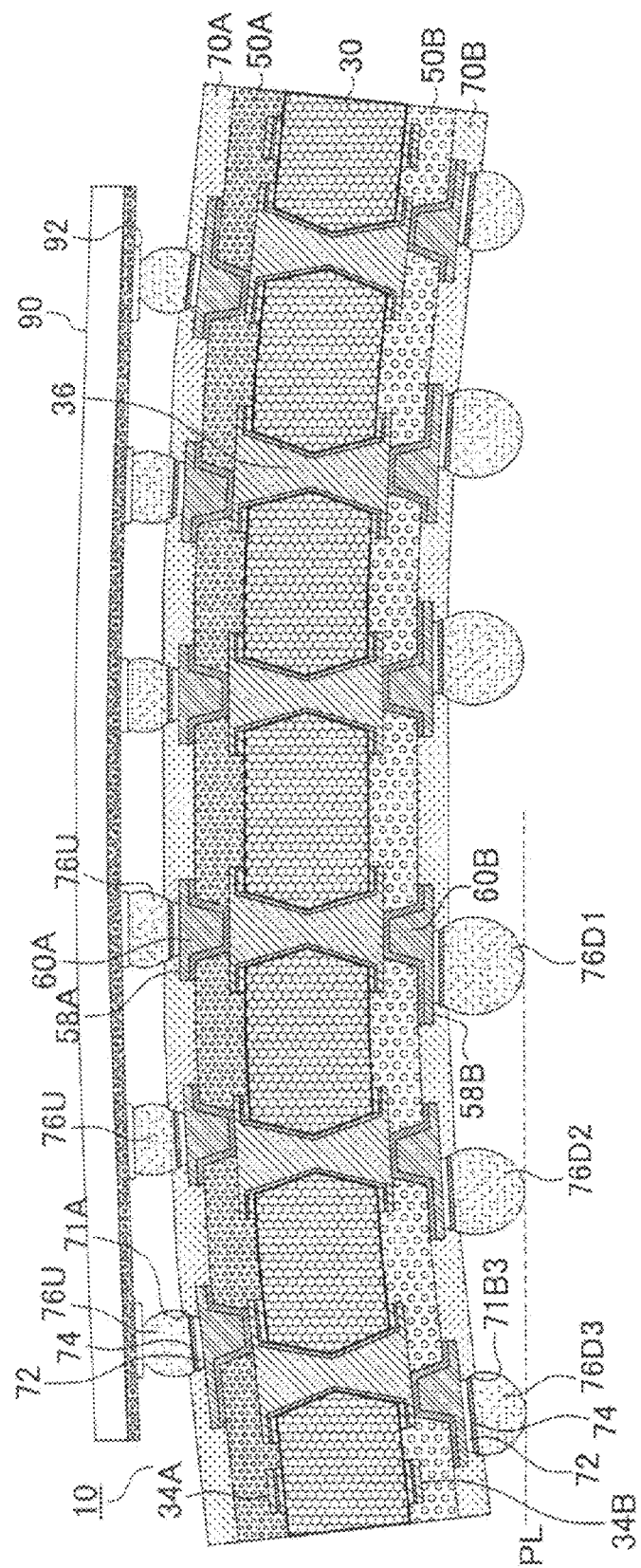
FIG. 11 is a view schematically showing warping of a printed wiring board of the third embodiment at a second mounting.

IC chip 90 is mounted on printed wiring board 10 of the third embodiment to complete a semiconductor device. The semiconductor device is mounted on a motherboard through a reflow process. Such mounting is referred to as a second mounting. Since the CTE of the upper buildup layer is higher than the CTE of the lower buildup layer in each embodiment and each modified example, a semiconductor device tends to warp as shown in FIG. 11 during second mounting. When a semiconductor device is placed on a flat board by positioning the IC chip to face upward, the printed wiring board tends to warp in such a way that its center bows upward. Connection failure tends to occur between a motherboard and the semiconductor element. Connection reliability is lowered between the motherboard and the semiconductor element. However, since the height of BGA bumps decreases from the center of a printed wiring board toward the periphery in the third embodiment, the top of each BGA bump is positioned on substantially the same plane (PL) even when the semiconductor device warps as shown in FIG. 11.

Figure 12:
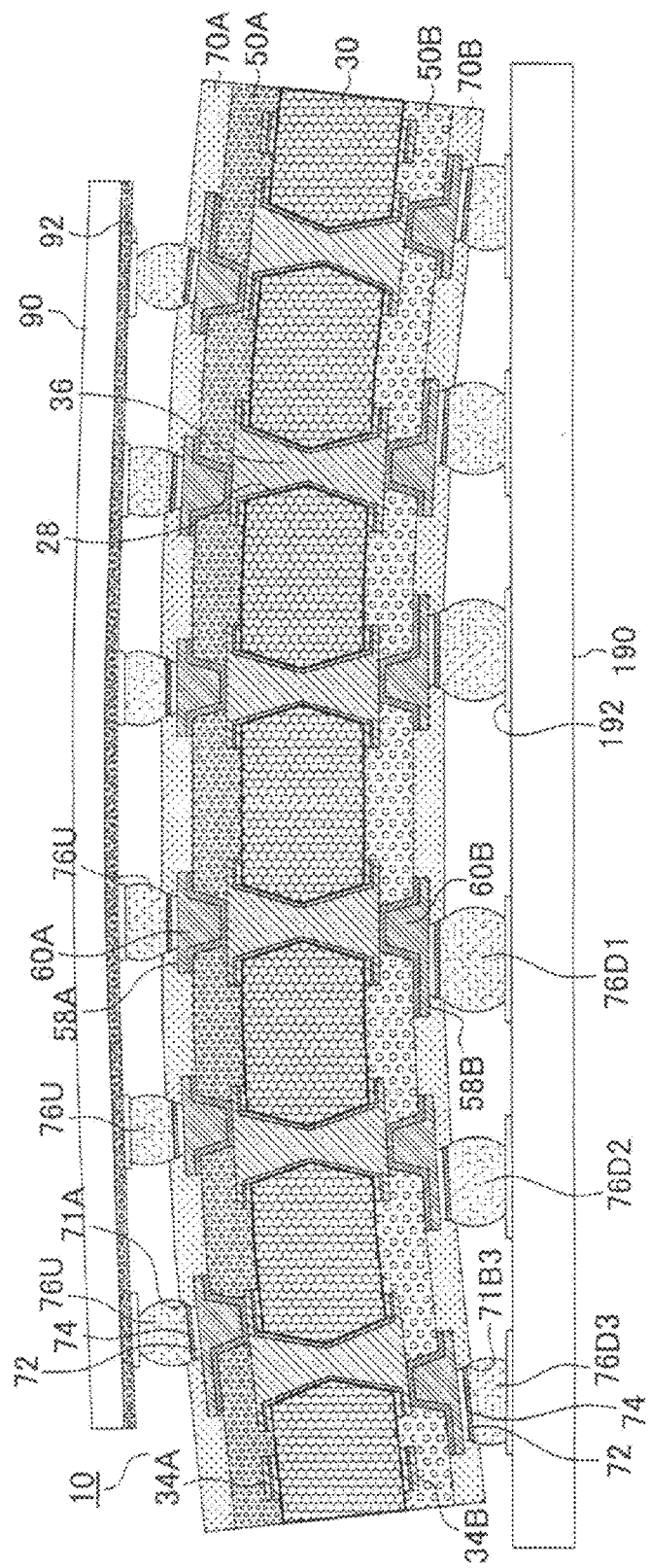
FIG. 12 is a view showing connection of a motherboard and a printed wiring board of the third embodiment at a second mounting.

FIG. 12 schematically shows a state during second mounting. Printed wiring board 10 is mounted on motherboard 190 in FIG. 12. In the third embodiment, since the tops of BGA bumps are positioned on substantially the same plane, a printed wiring board of the third embodiment is mounted on a flat motherboard even when the printed wiring board warps. Connection reliability is improved when a motherboard is connected with a printed wiring board through BGA bumps. The mounting yield of semiconductor devices improves.

FIG. 8 shows a method for manufacturing a printed wiring board of the third embodiment. The same as in the first embodiment, a core substrate and upper and lower buildup layers are formed (FIG. 2(C)).

Commercially available solder-resist films (70α, 70β) are formed on the upper and lower buildup layers. Such solder-resist films are sold by Hitachi Chemical Co., Ltd., for example. Solder-resist film (70α) is an upper solder-resist film and solder-resist film (70β) is a lower solder-resist film (FIG. 8(A)). Exposure and development treatments along with a curing treatment are conducted on solder-resist films (70α, 70β) to form solder-resist layers having openings (71A, 71B) (FIG. 8(B)). During the exposure treatment, exposure mask 18 is aligned on solder-resist film (70β) to expose solder-resist film (70β) to light through the exposure mask. Exposure mask 18 has shading portions. The size of the shading portions increases from the center of the exposure mask toward the periphery. Thus, the size of BGA pads increases from the center of the printed wiring board toward the periphery. On the other hand, solder-resist film (70α) is exposed to light through an exposure mask with shading portions of the same size. Accordingly, the sizes of C4 pads are the same. In the third embodiment, BGA pads are divided into three regions (central region, intermediate region, peripheral region). The size of first BGA pads is 230 µm, the size of second BGA pads is 240 µm, and the size of third BGA pads is 250 µm.

Next, the same as in the first embodiment, nickel-plated layer 72 is formed on C4 pads and BGA pads, and gold-plated layer 74 is further formed on nickel-plated layer 72 (FIG. 8(B)).

Then, the same as in the first embodiment, C4 bumps and BGA bumps are formed on pads. Each C4 pad has the same volume, and each BGA bump has the same volume. The height of each C4 bump is substantially the same, and the height of the BGA bumps decreases from the center of a printed wiring board toward the periphery.

An IC chip is mounted on a printed wiring board through C4 bumps (FIG. 11). A semiconductor device formed with an IC chip and a printed wiring board is completed.

Next, the semiconductor device is mounted on motherboard 190 through a reflow process (FIG. 12). The semiconductor device warps at reflow temperature as shown in FIG. 11. However, BGA bumps of the third embodiment are formed to have such heights to follow the warping of a semiconductor device. Accordingly, even when semiconductor devices warp, they are mounted on flat motherboards with a high mounting yield. Since motherboards are thick, they seldom warp at reflow temperature. In the third embodiment, since the tops of BGA bumps (76D1, 76D2, 76D3) are positioned on substantially the same plane, a warped printed wiring board and a flat motherboard are securely connected.

The connection reliability of BGA bumps is improved, and the yield of the steps for mounting a printed wiring board to a motherboard is enhanced.

C4 bumps and BGA bumps of each embodiment are made of solder. The contents described in the first embodiment, the second embodiment, and each modified example of the second embodiment apply to the third embodiment.

Fourth Embodiment

Figure 13:
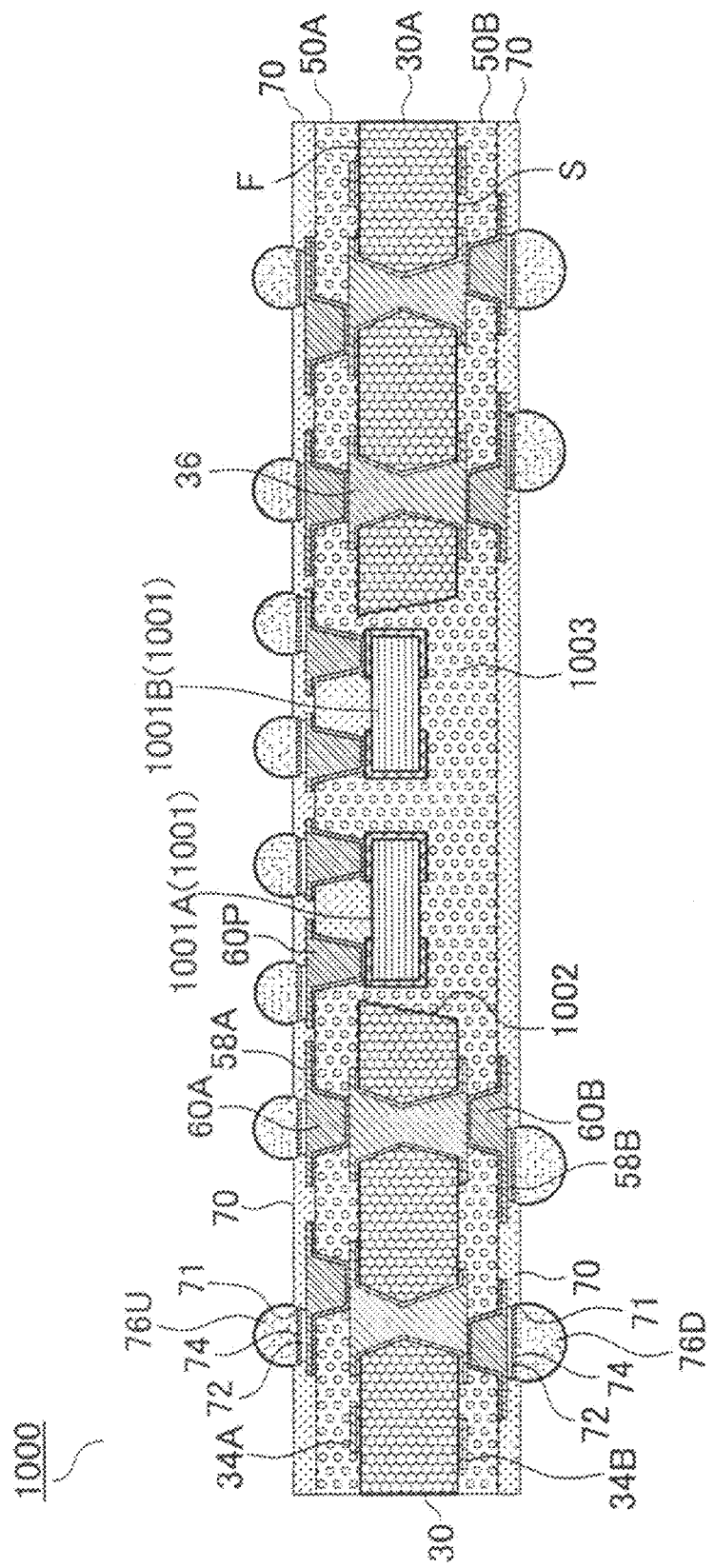
FIG. 13 is a cross-sectional view of a printed wiring board according to a fourth embodiment.

FIG. 13 shows printed wiring board 1000 of a fourth embodiment. The core substrate of a printed wiring board in the fourth embodiment is substantially the same as the core substrate of the first embodiment, but it further includes cavity 1002 to accommodate electronic component 1001 such as a chip capacitor. Cavity 1002 is preferred to be an opening that penetrates from a first surface of the insulative substrate through a second surface. A printed wiring board of the fourth embodiment is substantially the same as that of the first embodiment, but it further contains an electronic component in the cavity of the core substrate. Moreover, filler 1003 is formed between an electronic component and the core substrate in the printed wiring board of the fourth embodiment. Since a cavity is formed in the core substrate, the strength of the core substrate is low in the fourth embodiment. Accordingly, a printed wiring board of the fourth embodiment tends to warp during first mounting and second mounting. To control the direction of warping, the thermal expansion coefficient of the uppermost interlayer resin insulation layer in a printed wiring board of the fourth embodiment is set higher than that of the lowermost interlayer resin insulation layer. Since the core substrate has a cavity in the fourth embodiment, the amount of warping tends to increase in a printed wiring board of the fourth embodiment. An IC chip is mounted on a printed wiring board through a reflow process in the first mounting. As shown in the third embodiment, when the method of increasing the size of BGA pads from the center of a printed wiring board toward the periphery applies to printed wiring boards of the fourth embodiment, the yield of a second mounting improves. Connection reliability is enhanced between a motherboard and a printed wiring board. Also, as shown in the third embodiment, when the method of increasing the size of BGA pads from the center of a printed wiring board toward the periphery applies to the first embodiment, the second embodiment and each modified example of the second embodiment, the yield of a second mounting improves.

Figure 14:
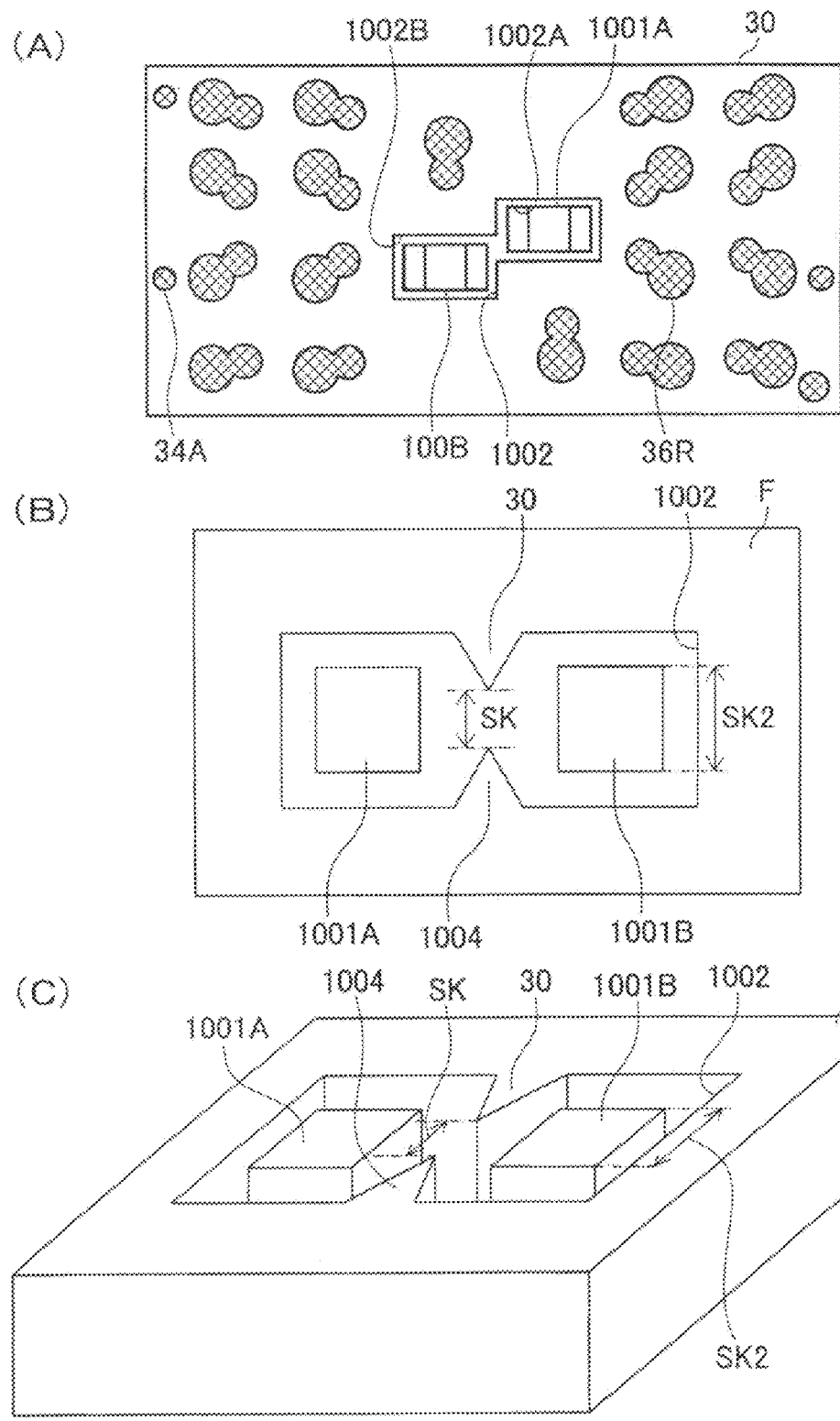
FIGS. 14(A) and 14(B) are plan views of a core substrate according to the fourth embodiment.
FIG. 14(C) is a perspective view of FIG. 14(B)

In FIG. 13, multiple electronic components (1001A, 1001B) are accommodated in one cavity 1002. Two electronic components are accommodated in one cavity in FIG. 13. Since the size of a cavity is enlarged when two electronic components are accommodated in one cavity, it is effective to increase the size of BGA pads from the center of a printed wiring board toward the periphery. Also, by setting the thermal expansion coefficient of the uppermost interlayer resin insulation layer to be higher than that of the lowermost interlayer resin insulation layer, the amount of warping of the printed wiring board is controlled. Accordingly, built-in electronic components are seldom damaged. The shapes of a cavity are shown in FIG. 14 for accommodating two electronic components in one cavity. In FIG. 14(A), part of multiple accommodation sections (1002A, 1002B) overlap to form one cavity 1002. The length of the overlapping portion is shorter than the length of electronic components. Electronic components are less likely to collide each other. One electronic component is accommodated in each accommodation section. FIG. 14(B) is a plan view to show the first surface of the core substrate, cavity 1002 and electronic components in the cavity. FIG. 14(C) is a perspective view of FIG. 14(B). Partitions 1004 are formed in a cavity as shown in FIG. 14(B). Partitions 1004 prevent electronic components from colliding each other. Distance (SK) between partitions is shorter than length (SK2) of electronic components.

Figure 15:
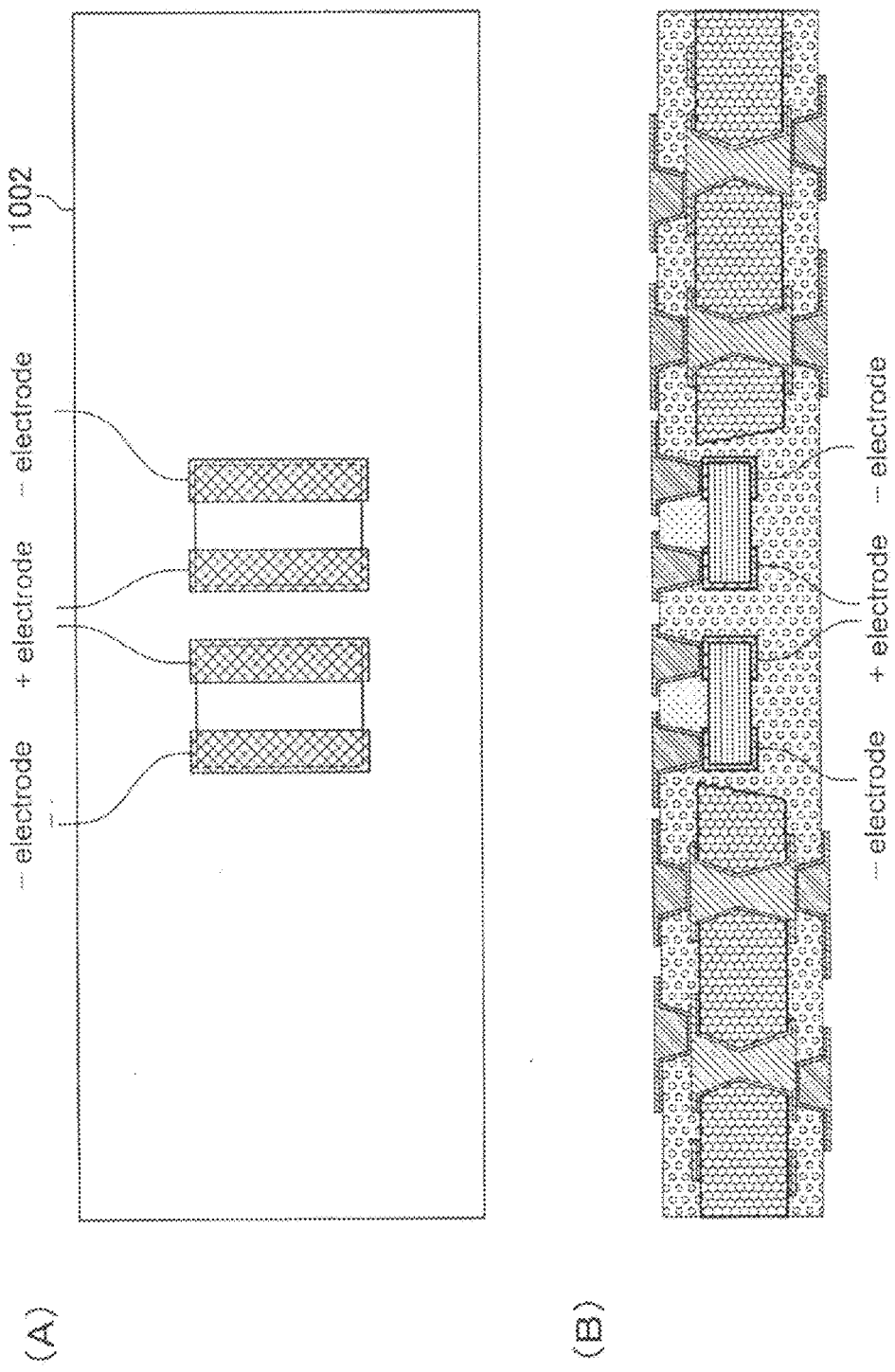
FIGS. 15(A)-15(B) are views showing cross sections of a printed wiring board of the fourth embodiment and electronic components in a cavity.

FIG. 15 shows an example where multiple chip capacitors are accommodated in one cavity. In FIG. 15, electrodes of the same polarity face each other in adjacent chip capacitors. In this example, plus electrodes face each other. Short circuiting does not occur when chip capacitors collide each other. When a printed wiring board has a cavity for accommodating electronic components, the size of a cavity is made smaller with the methods shown in FIGS. 14 and 15. By increasing the size of BGA pads from the center of a printed wiring board toward the periphery, connection reliability is enhanced between a printed wiring board of the fourth embodiment and a motherboard. Also, by adjusting thermal expansion coefficients of uppermost and lowermost interlayer resin insulation layers, it is easy to control warping during mounting.

It is preferred that BGA pads of printed wiring boards of the first embodiment, second embodiment, each modified example of the second embodiment, third embodiment and fourth embodiment be divided into multiple regions. The yield of a second mounting improves.

All the interlayer resin insulation layers are preferred to contain glass cloth made of T-glass in each embodiment and each modified example. Then, interlayer resin insulation layers with different thermal expansion coefficients are preferred to contain different resin amounts (wt. %). For interlayer resin insulation layers containing the same type of glass cloth to have different expansion coefficients by adjusting the resin amount (wt. %), the difference in resin amounts is 4 wt. % to 13 wt. %. Since each interlayer resin insulation layer has the same type of reinforcing material, cracking is unlikely to occur in the interlayer resin insulation layers.

An electronic component may be built into a cavity of the core substrate in a printed wiring board in each embodiment or each modified example described above. When the core substrate has a cavity and the thermal expansion coefficient of the uppermost interlayer resin insulation layer is set higher than that of the lowermost interlayer resin insulation layer, the warping of the printed wiring board is thought to be greater during mounting procedures. Thus, it is effective to apply the contents described in the first embodiment, the second embodiment, each modified example of the second embodiment and the third embodiment for a printed wiring board with a built-in electronic component.

As mobile electronics such as cell phones and portable terminals are becoming highly functional, the size of IC chips is increasing. Also, distances between electrodes of IC chips are decreasing. Such IC chips are mounted on printed wiring boards through solder bumps by a reflow process. Since IC chips contain highly rigid silicon substrates, it is thought that IC chips do not warp at mounting temperature (reflow temperature) or that the amount of warping of IC chips is small at mounting temperature. By contrast, since printed wiring boards contain resin, printed wiring boards have lower rigidity than silicon. Accordingly, it is thought that printed wiring boards tend to warp more than IC chips at mounting temperature.

When multiple printed wiring boards are manufactured, the thicknesses of interlayer resin insulation layers and the thicknesses of conductive layers are thought to be different for each printed wiring board due to irregularities during manufacturing. Thus, warping of printed wiring boards at the time of mounting is thought to be different for each printed wiring board. FIG. 18 shows examples of warping of printed wiring boards at mounting temperature: FIG. 18(A) is an example of a flat printed wiring board; FIG. 18(B) is an example where the center of the board is convex; and FIG. 18(C) is an example where the center of a board is concave. IC chips are to be mounted on the upper sides of printed wiring boards shown in FIG. 18.

When a large IC chip is mounted on a board shown in FIG. 18(C), the distance is thought to be short between the electrodes formed along the periphery of the IC chip and the printed wiring board. In such a case, solder bumps between the IC chip and the printed wiring board are thought to be collapsed. Thus, adjacent solder bumps are thought to make contact. As a result, mounting yields of IC chips are thought to decrease (FIG. 19).

A printed wiring board according to an embodiment of the present invention has the following: a core substrate which is formed with an insulative substrate having a first surface and a second surface opposite the first surface, a first conductive layer formed on the first surface of the insulative substrate, a second conductive layer formed on the second surface of the insulative substrate, and a through-hole conductor penetrating through the insulative substrate and connecting the first conductive layer and the second conductive layer; an upper buildup layer which is made up of an uppermost interlayer resin insulation layer laminated on the first surface of the insulative substrate and on the first conductive layer, an uppermost conductive layer formed on the uppermost interlayer resin insulation layer, and an uppermost via conductor penetrating through the uppermost interlayer resin insulation layer and connecting the uppermost conductive layer with the through-hole conductor or the first conductive layer; and a lower buildup layer which is made up of a lowermost interlayer resin insulation layer laminated on the second surface of the insulative substrate and on the second conductive layer, a lowermost conductive layer formed on the lowermost interlayer resin insulation layer, and a lowermost via conductor penetrating through the lowermost interlayer resin insulation layer and connecting the lowermost conductive layer with the through-hole conductor or the second conductive layer. In such a printed wiring board, the thermal expansion coefficient of the uppermost interlayer resin insulation layer is set higher than that of the lowermost interlayer resin insulation layer.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a core substrate comprising an insulative substrate, a first conductive layer formed on a first surface of the insulative substrate, and a second conductive layer formed on a second surface of the insulative substrate;
a first buildup layer laminated on a first surface of the core substrate and comprising an interlayer resin insulation layer, a conductive layer formed on the interlayer resin insulation layer of the first buildup layer, and a via conductor penetrating through the interlayer resin insulation layer of the first buildup layer and connected to the conductive layer of the first buildup layer; and
a second buildup layer laminated on a second surface of the core substrate and comprising an interlayer resin insulation layer, a conductive layer formed on the interlayer resin insulation layer of the second buildup layer, and a via conductor penetrating through the interlayer resin insulation layer of the second buildup layer and connected to the conductive layer of the second buildup layer,
wherein the interlayer resin insulation layer of the first buildup layer has a thermal expansion coefficient which is set higher than a thermal expansion coefficient of the interlayer resin insulation layer of the second buildup layer, and the thermal expansion coefficients of the interlayer resin insulation layers of the first and second buildup layers are set such that the thermal expansion coefficient of the interlayer resin insulation layer of the first buildup layer divided by the thermal expansion coefficient of the interlayer resin insulation layer of the second buildup layer is a value of greater than 1 but 1.5 or smaller, where the thermal expansion coefficients of the interlayer resin insulation layers of the first and second buildup layers are values in X-Y directions obtained in a temperature range of 195 degrees to 280 degrees.

2. The printed wiring board according to claim 1, wherein the interlayer resin insulation layer of the second buildup layer includes a glass cloth comprising T-glass, and the interlayer resin insulation layer of the first buildup layer includes a glass cloth comprising E-glass.

3. The printed wiring board according to claim 1, wherein the interlayer resin insulation layers of the first and second buildup layers include glass cloths, respectively, such that a thermal expansion coefficient of the glass cloth in the interlayer resin insulation layer of the first buildup layer divided by a thermal expansion coefficient of the glass cloth in the interlayer resin insulation layer of the second buildup layer is a value of 1.5 or greater but 2.5 or smaller.

4. A printed wiring board, comprising:
a core substrate comprising an insulative substrate, a first conductive layer formed on a first surface of the insulative substrate, and a second conductive layer formed on a second surface of the insulative substrate;
a first buildup layer laminated on a first surface of the core substrate and comprising an interlayer resin insulation layer, a conductive layer formed on the interlayer resin insulation layer of the first buildup layer, and a via conductor penetrating through the interlayer resin insulation layer of the first buildup layer and connected to the conductive layer of the first buildup layer; and
a second buildup layer laminated on a second surface of the core substrate and comprising an interlayer resin insulation layer, a conductive layer formed on the interlayer resin insulation layer of the second buildup layer, and a via conductor penetrating through the interlayer resin insulation layer of the second buildup layer and connected to the conductive layer of the second buildup layer,
wherein the interlayer resin insulation layer of the first buildup layer has a thermal expansion coefficient which is set higher than a thermal expansion coefficient of the interlayer resin insulation layer of the second buildup layer, and the interlayer resin insulation layers of the first and second buildup layers are formed such that Young's modulus of the interlayer resin insulation layer of the second buildup layer divided by Young's modulus of the interlayer resin insulation layer of the first buildup layer is a value in a range of from 1.05 to 2, where the Young's moduli of the interlayer resin insulation layers of the first and second buildup layers are values obtained in X-Y directions in a temperature range of 195 degrees to 280 degrees.

5. The printed wiring board according to claim 4, wherein the interlayer resin insulation layers of the first and second buildup layers include glass cloths, respectively, such that Young's modulus of the glass cloth in the interlayer resin insulation layer of the second buildup layer divided by Young's modulus of the glass cloth in the interlayer resin insulation layer of the first buildup layer is a value in a range of from 1.05 to 1.2.

6. The printed wiring board according to claim 1, wherein the first buildup layer comprises a plurality of pads positioned to mount a semiconductor device, and the plurality of pads is formed in a mounting region having a short side set in a range of from 8 mm to 15 mm and a long side set in a range of from 8 mm to 15 mm.

7. A printed wiring board, comprising:
a core substrate comprising an insulative substrate, a first conductive layer formed on a first surface of the insulative substrate, a second conductive layer formed on a second surface of the insulative substrate, and a through-hole conductor penetrating through the insulative substrate and connecting the first conductive layer and the second conductive layer;
a first buildup layer comprising an interlayer resin insulation layer laminated on the first surface of the insulative substrate and the first conductive layer, a conductive layer formed on the interlayer resin insulation layer of the first buildup layer, and a via conductor penetrating through the interlayer resin insulation layer of the first buildup layer and connecting the conductive layer of the first buildup layer to one of the through-hole conductor and the first conductive layer in the core substrate; and
a second buildup layer comprising an interlayer resin insulation layer laminated on the second surface of the insulative substrate and the second conductive layer, a conductive layer formed on the interlayer resin insulation layer of the second buildup layer, and a via conductor penetrating through the interlayer resin insulation layer of the second buildup layer and connecting the conductive layer of the second buildup layer to one of the through-hole conductor and the second conductive layer in the core substrate,
wherein the interlayer resin insulation layer of the first buildup layer has a thermal expansion coefficient which is set higher than a thermal expansion coefficient of the interlayer resin insulation layer of the second buildup layer, where the thermal expansion coefficients of the interlayer resin insulation layers of the first and second buildup layers are values in X-Y directions obtained in a temperature range of 195 degrees to 280 degrees.

8. The printed wiring board according to claim 7, wherein the interlayer resin insulation layer of the second buildup layer includes a glass cloth comprising T-glass, and the interlayer resin insulation layer of the first buildup layer includes a glass cloth comprising E-glass.

9. The printed wiring board according to claim 7, wherein the thermal expansion coefficients of the interlayer resin insulation layers of the first and second buildup layers are values obtained in a temperature range of 195 degrees to 255 degrees.

10. A printed wiring board, comprising:
a core substrate comprising an insulative substrate, a first conductive layer formed on a first surface of the insulative substrate, a second conductive layer formed on a second surface of the insulative substrate, and a through-hole conductor penetrating through the insulative substrate and connecting the first conductive layer and the second conductive layer;
a first buildup layer comprising an interlayer resin insulation layer laminated on the first surface of the insulative substrate and the first conductive layer, a conductive layer formed on the interlayer resin insulation layer of the first buildup layer, and a via conductor penetrating through the interlayer resin insulation layer of the first buildup layer and connecting the conductive layer of the first buildup layer to one of the through-hole conductor and the first conductive layer in the core substrate; and
a second buildup layer comprising an interlayer resin insulation layer laminated on the second surface of the insulative substrate and the second conductive layer, a conductive layer formed on the interlayer resin insulation layer of the second buildup layer, and a via conductor penetrating through the interlayer resin insulation layer of the second buildup layer and connecting the conductive layer of the second buildup layer to one of the through-hole conductor and the second conductive layer in the core substrate,
wherein the interlayer resin insulation layer of the first buildup layer has a thermal expansion coefficient which is set higher than a thermal expansion coefficient of the interlayer resin insulation layer of the second buildup layer, where the thermal expansion coefficients of the interlayer resin insulation layers of the first and second buildup layers are set such that the thermal expansion coefficient of the interlayer resin insulation layer of the first buildup layer divided by the thermal expansion coefficient of the interlayer resin insulation layer of the second buildup layer is a value of greater than 1 but 1.5 or smaller.

11. The printed wiring board according to claim 10, wherein the interlayer resin insulation layers of the first and second buildup layers include glass cloths, respectively, such that a thermal expansion coefficient of the glass cloth in the interlayer resin insulation layer of the first buildup layer divided by a thermal expansion coefficient of the glass cloth in the interlayer resin insulation layer of the second buildup layer is a value of 1.5 or greater but 2.5 or smaller.

12. The printed wiring board according to claim 7, wherein the interlayer resin insulation layers of the first and second buildup layers are formed such that Young's modulus of the interlayer resin insulation layer of the second buildup layer divided by Young's modulus of the interlayer resin insulation layer of the first buildup layer is a value in a range of from 1.05 to 2.

13. The printed wiring board according to claim 12, wherein the interlayer resin insulation layers of the first and second buildup layers include glass cloths, respectively, such that Young's modulus of the glass cloth in the interlayer resin insulation layer of the second buildup layer divided by Young's modulus of the glass cloth in the interlayer resin insulation layer of the first buildup layer is a value in a range of from 1.05 to 1.2.

14. The printed wiring board according to claim 12, wherein the Young's moduli of the interlayer resin insulation layers of the first and second buildup layers are values obtained in X-Y directions in a temperature range of 195 degrees to 280 degrees.

15. The printed wiring board according to claim 14, wherein the Young's moduli of the interlayer resin insulation layers of the first and second buildup layers are values obtained in a temperature range of 195 degrees to 260 degrees.

16. The printed wiring board according to claim 7, wherein the first buildup layer comprises a plurality of pads positioned to mount a semiconductor device, and the plurality of pads is formed in a mounting region having a short side set in a range of from 8 mm to 15 mm and a long side set in a range of from 8 mm to 15 mm.

17. The printed wiring board according to claim 16, further comprising the semiconductor device mounted on the mounting region of the first buildup layer through the plurality of pads, wherein the semiconductor device has a thickness in a range of from 0.05 mm to 0.15 mm.

18. The printed wiring board according to claim 7, wherein the printed wiring board has a side having a length in a range of from 15 mm to 25 mm.

19. The printed wiring board according to claim 4, wherein the first buildup layer comprises a plurality of pads positioned to mount a semiconductor device, and the plurality of pads is formed in a mounting region having a short side set in a range of from 8 mm to 15 mm and a long side set in a range of from 8 mm to 15 mm.

20. The printed wiring board according to claim 10, wherein the first buildup layer comprises a plurality of pads positioned to mount a semiconductor device, and the plurality of pads is formed in a mounting region having a short side set in a range of from 8 mm to 15 mm and a long side set in a range of from 8 mm to 15 mm.

\* \* \* \* \*